(12) United States Patent
Jin

(10) Patent No.: US 7,262,110 B2
(45) Date of Patent: Aug. 28, 2007

(54) TRENCH ISOLATION STRUCTURE AND METHOD OF FORMATION

(75) Inventor: Joohyun Jin, Boise, ID (US)

(73) Assignee: Micron Technology, Inc., Boise, ID (US)

(*) Notice: Subject to any disclaimer, the term of this patent is extended or adjusted under 35 U.S.C. 154(b) by 126 days.

(21) Appl. No.: 10/922,831

(22) Filed: Aug. 23, 2004

(65) Prior Publication Data

US 2006/0038254 A1 Feb. 23, 2006

(51) Int. Cl.
*H01L 21/76* (2006.01)
*H01L 21/425* (2006.01)
*H01L 21/38* (2006.01)
*H01L 21/22* (2006.01)
*H01L 29/76* (2006.01)
*H01L 29/00* (2006.01)

(52) U.S. Cl. ............ 438/424; 438/400; 438/418; 438/420; 438/423; 438/427; 438/431; 438/433; 438/435; 438/514; 438/546; 257/314; 257/374; 257/506; 257/510; 257/E21.551; 257/E21.352; 257/E21.546

(58) Field of Classification Search .......... 438/424, 438/423, 427, 400, 431, 420, 435, 418, 433, 438/546, 514; 257/314, 374, 506, 510
See application file for complete search history.

(56) References Cited

U.S. PATENT DOCUMENTS

| | | | | |
|---|---|---|---|---|
| 4,692,992 A | * | 9/1987 | Hsu | 438/223 |
| 4,726,879 A | * | 2/1988 | Bondur et al. | 438/712 |
| 4,799,990 A | * | 1/1989 | Kerbaugh et al. | 438/433 |
| 5,406,111 A | * | 4/1995 | Sun | 257/497 |
| 6,177,333 B1 | | 1/2001 | Rhodes | |
| 6,177,697 B1 | * | 1/2001 | Cunningham | 257/301 |
| 6,232,626 B1 | * | 5/2001 | Rhodes | 257/292 |
| 6,437,417 B1 | | 8/2002 | Gilton | |
| 6,979,628 B2 | * | 12/2005 | Kim et al. | 438/427 |
| 7,045,414 B2 | * | 5/2006 | Chen et al. | 438/231 |
| 7,045,436 B2 | * | 5/2006 | Chatterjee et al. | 438/433 |
| 2004/0229426 A1 | * | 11/2004 | Lee et al. | 438/248 |
| 2004/0251481 A1 | * | 12/2004 | Rhodes | 257/292 |
| 2005/0118768 A1 | * | 6/2005 | Chen | 438/301 |

OTHER PUBLICATIONS

NB83046131☐☐IBM Technical Disclosure Bulletin, Apr. 1983, US☐☐vol. No.: 25☐☐Issue No.: 11B.*
NB83046131, Apr. 1983, IBM Technical Discloser B.*

* cited by examiner

*Primary Examiner*—Michael Lebentritt
*Assistant Examiner*—Mohsen Ahmadi
(74) *Attorney, Agent, or Firm*—Dickstein Shapiro LLP

(57) ABSTRACT

In general, the present invention discloses at least one trench isolation region formed in a semiconductor substrate to electrically and/or optically isolate at least one active region from another active region. The at least one trench isolation region comprises a bottom portion and first and second trench sidewalls. At least one trench sidewall is adjacent a doped region. The at least one sidewall adjacent a doped region has a higher impurity dopant concentration than impurity doped regions surrounding the at least one trench isolation region.

36 Claims, 24 Drawing Sheets

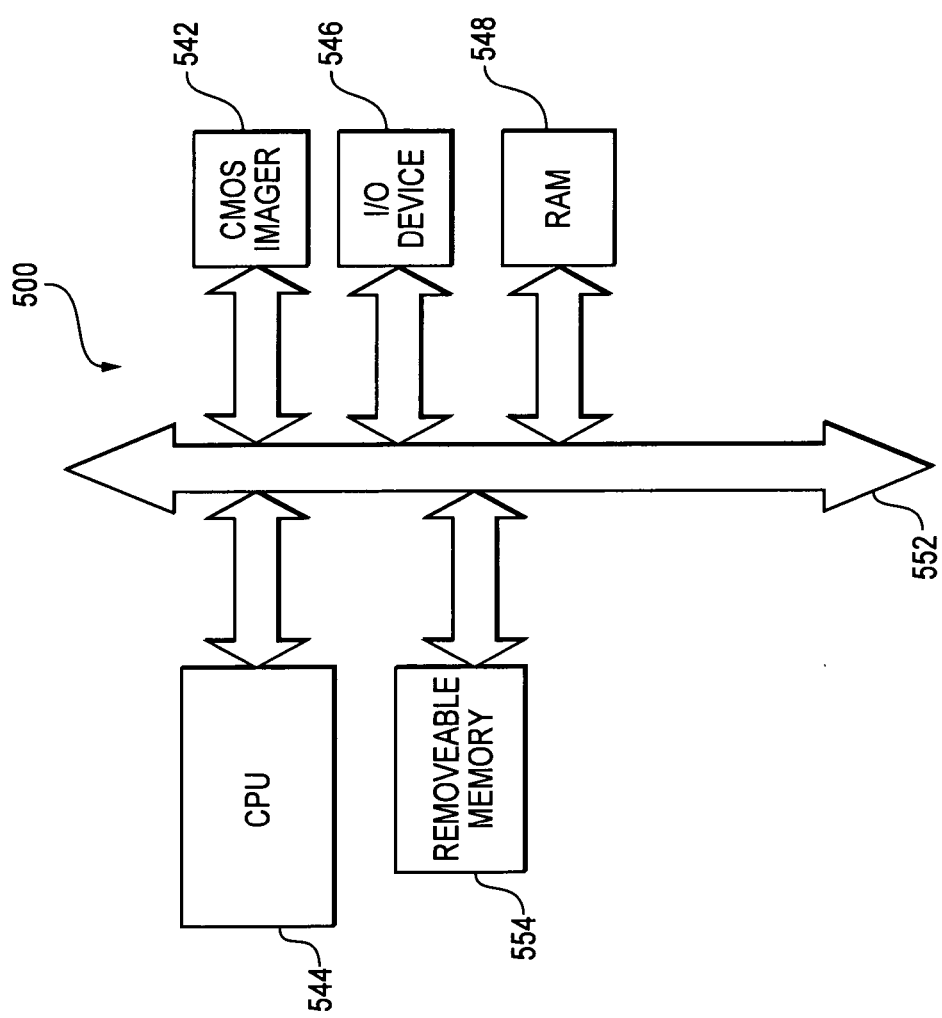

TRENCH ISOLATION STRUCTURE AND METHOD OF FORMATION

FIELD OF INVENTION

The present invention relates to the field of semiconductor integrated circuits and, in particular, to a trench isolation structure and its method of formation.

BACKGROUND OF THE INVENTION

Trench isolation regions are an essential part of fabricating microelectronic circuits. The decreasing dimensions of devices and the increasing density of integration in microelectronic circuits have required a corresponding reduction in the size of isolation structures. This reduction places a premium on reproducible formation of isolation structures which provide effective isolation, while occupying a minimum amount of the substrate surface.

Trench isolation regions are typically formed by etching trenches into a substrate and filling them with a dielectric material to provide a physical barrier between adjacent structures. For example, trench isolation regions are used to electrically and/or optically isolate adjacent pixels in a pixel array, as well as isolating the pixel array from various other active components formed on an imager integrated circuit. One trench isolation region widely employed in semiconductor fabrication is the shallow trench isolation (STI) region.

In the STI technique, a plurality of trenches are formed at predefined locations in the substrate. This occurs usually through a dry anisotropic or other suitable etching process. The trenches are then filled with a dielectric such as a chemical vapor deposited (CVD) silicon dioxide ($SiO_2$) or a high density plasma (HDP) oxide. The filled trenches are then planarized so that the dielectric remains only in the trenches and their top surface remains level with that of the substrate.

Traditional STI fabrication methods, however, have several drawbacks. One problem arises due to stress in the bottom of the trench. The rectangular corners formed at the bottom of conventional STI trenches can lead to stress and dislocations in the isolation dielectric. This can further lead to current leakage paths and contaminants, which in turn reduce the effectiveness of the isolation structure.

In addition, sidewall inversion may be a problem caused by a horizontal parasitic metal-oxide-semiconductor (MOS) device with a well acting as a gate electrode and the trench dielectric acting as a MOS gate oxide. The sidewall inversion problem is worse for n-well technology because the fixed oxide charge, normally positive, can escalate the sidewall inversion problem. Once sidewall inversion occurs, N-channel devices with an n+region abutting the same sidewall will short along the sidewall of the trench. An obvious solution is to separate the n+ region and the sidewalls of the trench, or to increase trench width. This takes up valuable space, however, decreasing the packing density required in integrated circuit chips.

Another common problem associated with the formation of the above-described trench isolation regions is that when dopants are implanted in the substrate close to the bottom and sidewalls of the trench, current leakage can occur at the junction between the active device regions and the trench. This is particularly undesirable in solid state imagers.

The dominant crystallographic planes along the bottom and sidewalls of the trench isolation regions have a higher silicon density than the adjacent silicon substrate; thereby, creating a high density of trap sites along the trench bottom and sidewalls. These trap sites are normally uncharged but become charged when electrons and holes become trapped in the trap sites. As a result of these trap sites, current generation near and along the trench bottom and sidewalls in solid state imagers can be significant. Current generated from trap sites inside or near the photodiode depletion region causes undesired dark current.

There is needed, therefore, an improved trench isolation region and a method for fabricating the same which avoids the sidewall inversion problem and which prevents current generation or current leakage in a solid state imager. A method of fabricating an imager having these characteristics is also needed.

BRIEF SUMMARY OF THE INVENTION

Exemplary embodiments of the invention provide at least one trench isolation region formed in a semiconductor substrate to electrically isolate and/or optically isolate one active region from another. The trench isolation region comprises a bottom portion and first and second trench sidewalls. At least one trench sidewall is formed within a region comprising impurity dopants of a first conductivity. The bottom portion and the other trench sidewall may also be formed within the region comprising impurity dopants of the first conductivity. The at least one trench sidewall, and optionally the second sidewall and bottom portion of the trench, is/are adjacent a higher impurity dopant concentration region than other impurity doped regions which are spaced from the isolation region by the higher impurity dopant concentration region.

An exemplary fabrication embodiment includes the steps of implanting dopants into a predefined region of a semiconductor substrate, and forming at least one trench isolation region in the implanted doped region of the substrate, such that the trench isolation region comprising a bottom portion and first and second trench sidewalls has at least one trench sidewall adjacent the implanted doped region. The trench isolation region is then filled with a dielectric material. The other trench sidewall and bottom portion of the trench may also be adjacent the implanted doped region. The at least one trench sidewall, and optionally the second sidewall and bottom portion of the trench, is/are adjacent a higher impurity dopant concentration region than other impurity doped regions which are spaced from the isolation region by the higher impurity dopant concentration region.

In another exemplary embodiment, the invention provides a pixel cell separated by at least one trench isolation region. The at least one trench isolation region comprises a bottom portion and first and second trench sidewalls. At least one trench sidewall, and optionally the other sidewall and bottom portion of the at least one trench isolation region, is adjacent a doped implanted region. The at least one trench sidewall, and optionally the second sidewall and bottom portion of the at least one trench isolation region, is/are adjacent a higher impurity dopant concentration region than other impurity doped regions which are spaced from the at least one trench isolation region by the higher impurity dopant concentration region.

In yet another exemplary embodiment, the invention provides a method of forming at least one trench isolation region for a pixel cell of a solid state imager in which at least one trench sidewall, and optionally the other trench sidewall and a bottom portion of the at least one trench isolation region, is formed adjacent an implanted doped region. A photosensor region is formed adjacent the at least one sidewall of the at least one trench isolation region. The at least one trench sidewall, and optionally the second sidewall and bottom portion of the at least one trench isolation region, is/are adjacent a higher impurity dopant concentration region than other impurity doped regions which are spaced from the at least one trench isolation region by the higher impurity dopant concentration region.

These and other features of the invention will be more apparent from the following detailed description that is provided in connection with the accompanying drawings and illustrated exemplary embodiments of the invention.

BRIEF DESCRIPTION OF THE DRAWINGS

FIG. 20 is an illustration of a computer system having a CMOS imager with trench isolation regions formed in accordance with a method of the invention.

DETAILED DESCRIPTION OF THE INVENTION

Figure 1A:
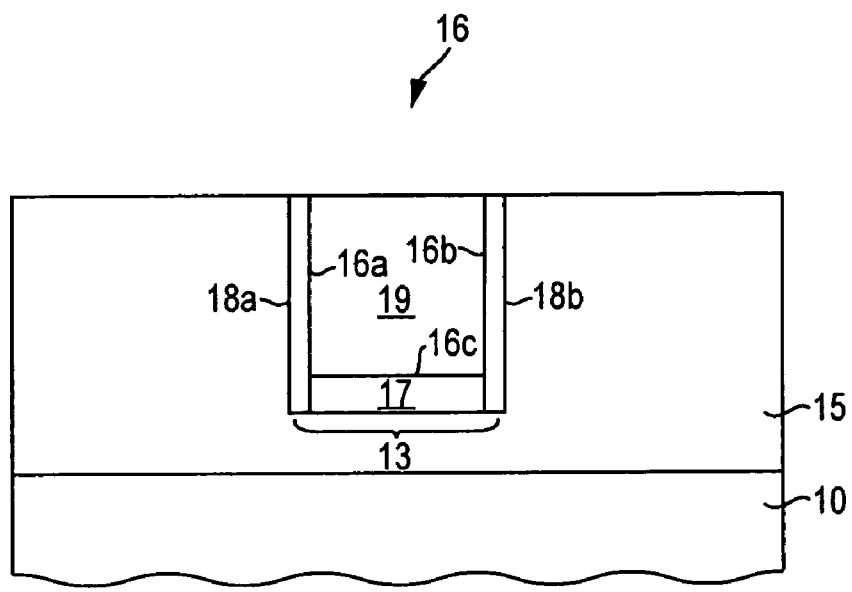
FIG. 1A is a cross-sectional view of a portion of a semiconductor substrate containing a trench isolation region formed in accordance with one exemplary structural embodiment of the invention.

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized, and that structural, logical and electrical changes may be made without departing from the spirit and scope of the present invention.

The terms "wafer" and "substrate" are to be understood as a semiconductor-based material including silicon, silicon-on-insulator (SOI) or silicon-on-sapphire (SOS) technology, doped and un-doped silicon semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in or over the base semiconductor structure or foundation. In addition, the semiconductor need not be silicon-based, but could be based on silicon-germanium, silicon-on-insulator, silicon-on-sapphire, germanium, or gallium arsenide, among others.

The term "pixel" refers to a picture element unit cell containing a photosensor and transistors for converting electromagnetic radiation to an electrical signal. For purposes of illustration, a representative pixel is illustrated in FIGS. 11A-11D and description herein and, typically, fabrication of all pixels in an imager array will proceed simultaneously in a similar fashion.

The invention is now explained with reference to FIGS. 1-20. FIGS. 1-20 illustrate various structural and method of formation exemplary embodiments of a semiconductor device with a trench isolation region having at least one sidewall adjacent a doped region in accordance with the invention.

Referring now to FIGS. 1A-1E, a semiconductor wafer includes a bulk substrate 10. Typically, dopants are implanted into the bulk substrate 10 to form n-type wells and p-type wells that define the locations of n-channel and p-channel devices. For instance, the substrate 10 can be implanted with a p-type dopant such as boron to form a p-well 15. Any p-type dopant, such as boron, beryllium, indium or magnesium, among others, can be used. The p-well 15 has a first p-type dopant concentration.

For purposes of a simplified description, FIGS. 1A-1E illustrate various active areas and a single trench isolation region in a single well type. In general, however, the invention is applicable to other semiconductor device isolation regions such as n-well and p-well regions in p-type substrates, n-type substrates, and epitaxial substrates, including p on p+, p on p−, n on n+, and n on n−.

Still referring to FIGS. 1A-1E, a trench isolation region 16 is formed within p-well 15 and substrate 10. The trench isolation region 16 comprises a bottom portion 16c, a first trench sidewall portion 16a, and a second trench sidewall portion 16b.

In one exemplary structural embodiment, illustrated in FIG. 1A, doped regions 18a, 18b, and 17 of p-well 15 are located adjacent to respective portions 16a, 16b, and 16c of the trench isolation region 16. Regions 18a, 18b, and 17 contain p-type dopants in a higher dopant concentration than the p-type dopant concentration in surrounding p-well 15.

In the case of a p-type substrate 10 with p-wells 15, p-type dopants are found in doped regions 18a, 18b, and bottom portion 17. However, in the case of a p-type substrate 10 with n-well 15; doped regions 18a, 18b, and bottom portion 17 will contain n-type dopants. In addition, p-type doped regions 18a and 18b can have the same or different dopant concentrations than p-type doped region 17. Moreover, p-type doped region 18a can have the same or different dopant concentration from p-type doped region 18b. P-type doped region 17 may be formed after and be self-aligned to p-type doped regions 18a and 18b.

Referring back to FIG. 1A, which shows trench sidewalls 16a, 16b, and bottom portion 16c adjacent respective doped regions 18a, 18b, and 17, FIG. 1A further illustrates that p-type doped region 17 is formed to overlap with p-type doped regions 18a and 18b i.e., the p-type doped regions 18a, 18b, and 17 are formed to the same depth in substrate 10 and p-well 15.

Figure 1B:
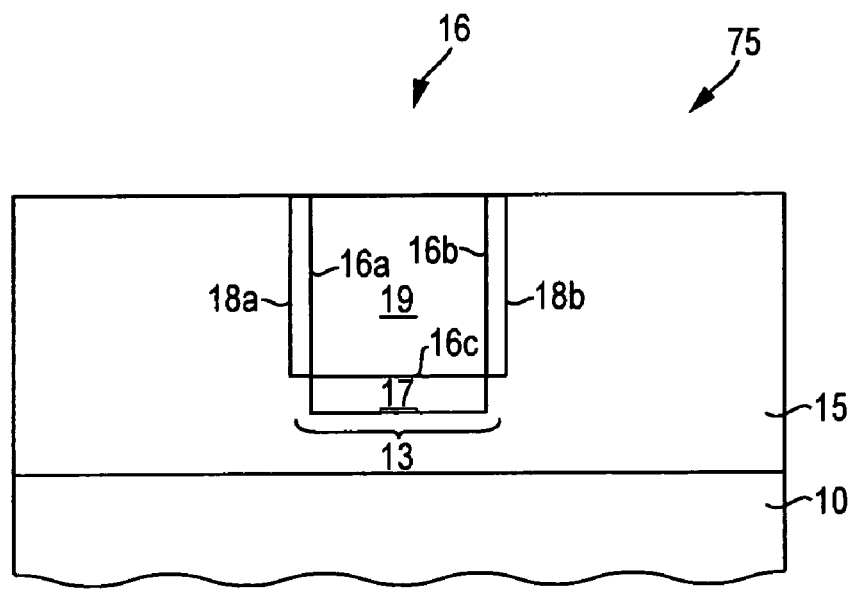
FIG. 1B is a cross-sectional view of a portion of a semiconductor substrate containing a trench isolation region formed in accordance with another exemplary structural embodiment of the invention.

The p-type doped region 17, however, in another exemplary structural variant, can be formed such that p-type doped regions 18a and 18b do not overlap with p-type doped region 17 as illustrated in FIG. 1B. In other words, p-type doped region 17 is formed deeper in substrate 10 and p-well 15 than p-type doped regions 18a and 18b. P-type doped regions 18a and 18b are formed to be approximately the same depth in substrate 10 and p-well 15. P-type doped region 17 is formed after and is self-aligned to p-type doped regions 18a and 18b.

Figure 1C:
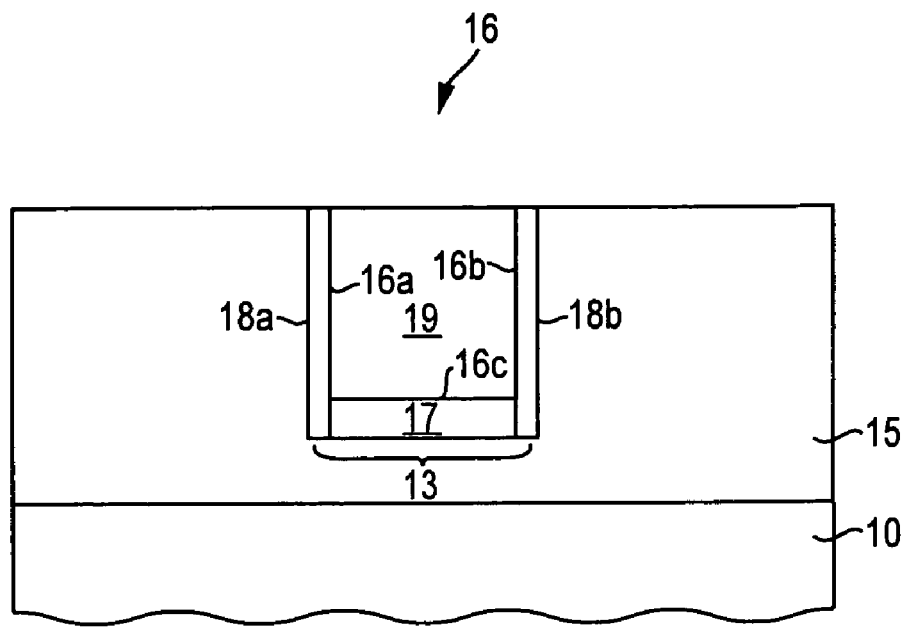
FIG. 1C is a cross-sectional view of a portion of a semiconductor substrate containing a trench isolation region formed in accordance with one exemplary structural embodiment of the invention.

In another exemplary structural variant, only one trench sidewall i.e., 16a, is adjacent a corresponding doped region i.e., 18a, while the other trench sidewall 16b and bottom portion 16c of the trench 16, is adjacent the p-well 15, as illustrated in FIG. 1C. It should also be appreciated that the other trench sidewall i.e., 16b of FIG. 1A, can also be only formed adjacent a corresponding doped region i.e., 18b, while the other trench sidewall 16a and bottom portion 16c of the trench 16, is adjacent p-well 15.

Figure 1D:
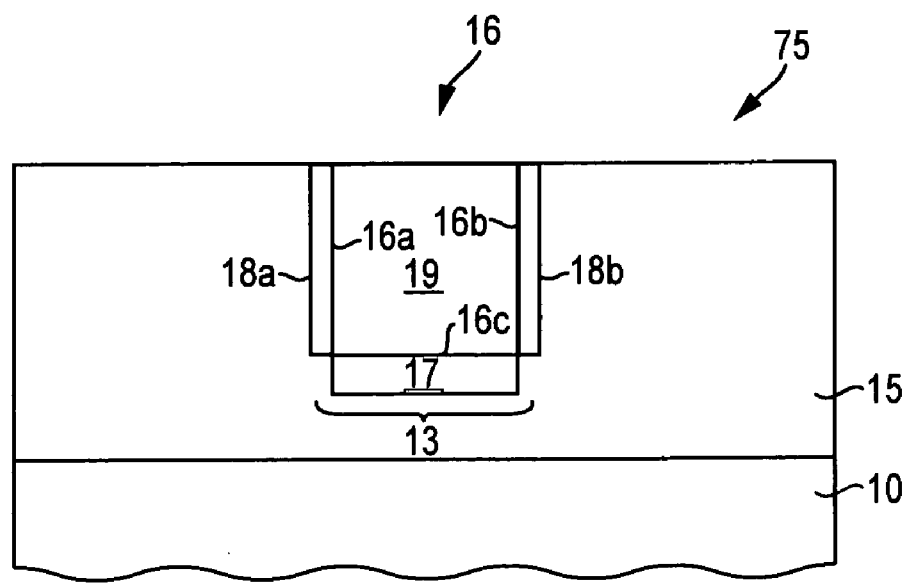
FIG. 1D is a cross-sectional view of a portion of a semiconductor substrate containing a trench isolation region formed in accordance with one exemplary structural embodiment of the invention.

In still another variation, only one trench sidewall 16a and bottom portion 16c of the trench 16, are adjacent respective doped regions 18a and 17, while the other trench sidewall 16b is adjacent the p-well 15, as illustrated in FIG. 1D. Region 17 is not self-aligned to trench sidewall 16b. However, additional ion implantations could be performed to extend region 17 to be self-aligned to trench sidewall 16b. It should also be appreciated that the other trench sidewall i.e., 16b of FIG. 1A and bottom portion 16c of the trench 16, can be formed adjacent respective doped regions 18b and 17, while the other trench sidewall 16a is adjacent the p-well 15.

Figure 1E:
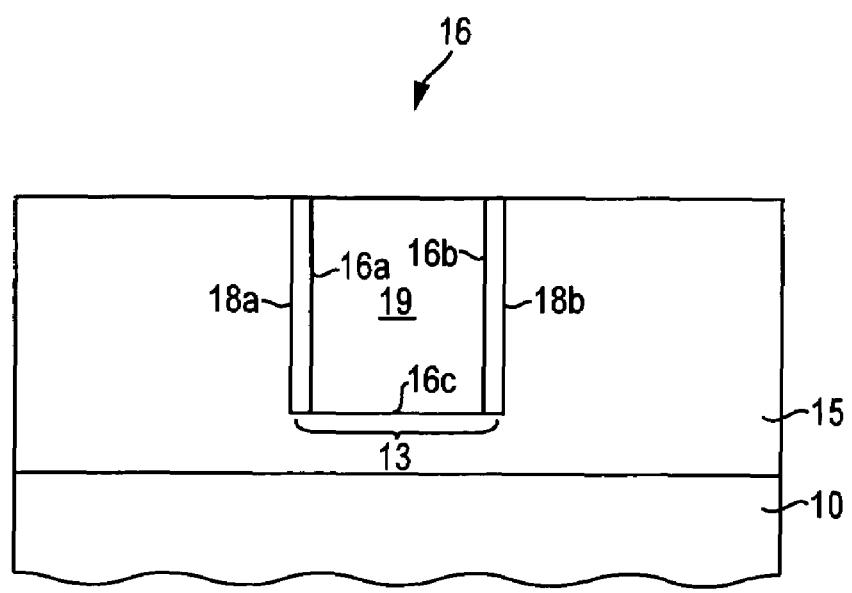
FIG. 1E is a cross-sectional view of a portion of a semiconductor substrate containing a trench isolation region formed in accordance with another exemplary structural embodiment of the invention.

In still yet another variation, only trench sidewalls 16a and 16b are adjacent respective doped regions 18a and 18b, while the bottom portion 16c of the trench is adjacent the p-well 15, as illustrated in FIG. 1E.

In FIGS. 1A-1E, the trench isolation region 16 is filled with an oxide material 19. Typically, a high density plasma oxide (HDP) is used to fill the trench 16 and is planarized to at least the level of the top surface of the substrate 10. Additional processes can then be performed using known techniques in the art to complete an integrated circuit (IC) that includes active semiconductor regions separated by a trench isolation region 16. Although only one trench isolation region 16 is illustrated in FIGS. 1A-1E, the invention can be used to simultaneously form a plurality of trench isolation regions 16.

Various types of devices can be formed in the active areas of the substrate 10 which are isolated by trench isolation region 16. Such devices include photosensors, diodes, transistors, etc., which may be used as imaging devices, memory devices, logic devices, or other IC circuits. For example, the completed IC can include an array of light-sensitive pixels for a solid state imager, or an array of memory cells for a DRAM or other memory device. In other IC's, logic devices for gate arrays, microprocessors or digital signal processors can be formed in the active regions isolated by the trench isolation region 16.

Exemplary methods for forming the trench isolation region 16 depicted in various embodiments in FIGS. 1A-1E is explained in detail hereinafter, with reference to FIGS. 2-8. FIGS. 2-8 illustrate process steps according to exemplary fabrication embodiments of the present invention.

Figure 2:
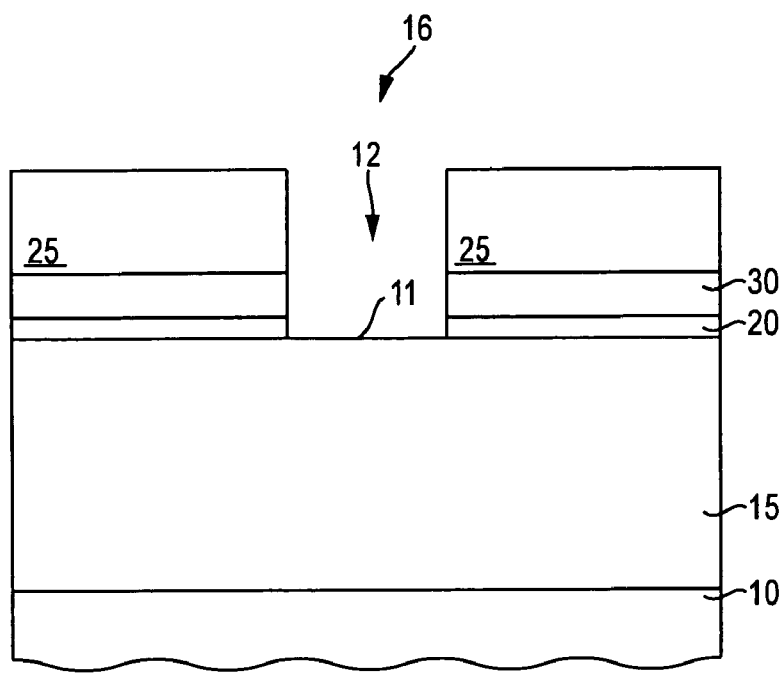
FIG. 2 is a cross-sectional view of a representative substrate undergoing the formation of a trench isolation region, performed in accordance with a method of one exemplary embodiment of the invention.

Referring now to FIG. 2, dopants are implanted into the bulk substrate 10 to form n-type wells and p-type wells that define the locations of the n-channel and p-channel devices. For instance, the substrate 10 can be implanted with a p-type dopant, such as boron, to form a p-well 15. The p-well 15 is formed to have a first p-type dopant concentration.

Next, a pad oxide film layer 20 is blanket deposited over the substrate 10. The pad oxide layer 20 can be formed by deposition or by oxidizing conditions. A first sacrificial layer 30, such as silicon nitride ($Si_3N_4$), is blanket deposited over the pad oxide film layer 20. Then, a mask 25, such as a photoresist layer, is blanket deposited and patterned over the first sacrificial layer 30 and pad oxide layer 20. The mask 25 can be patterned by any conventional photolithographic technique.

Still referring to FIG. 2, the first sacrificial layer 30 and the pad oxide layer 20 are etched through an opening in mask 25 by any conventional etching process. For example, an anisotropic etch or reactive ion etch process can be used. The etching process is conducted until the surface 11 of the substrate 10 is reached. This forms opening 12. The etching process does not etch into the substrate 10.

Figure 3:
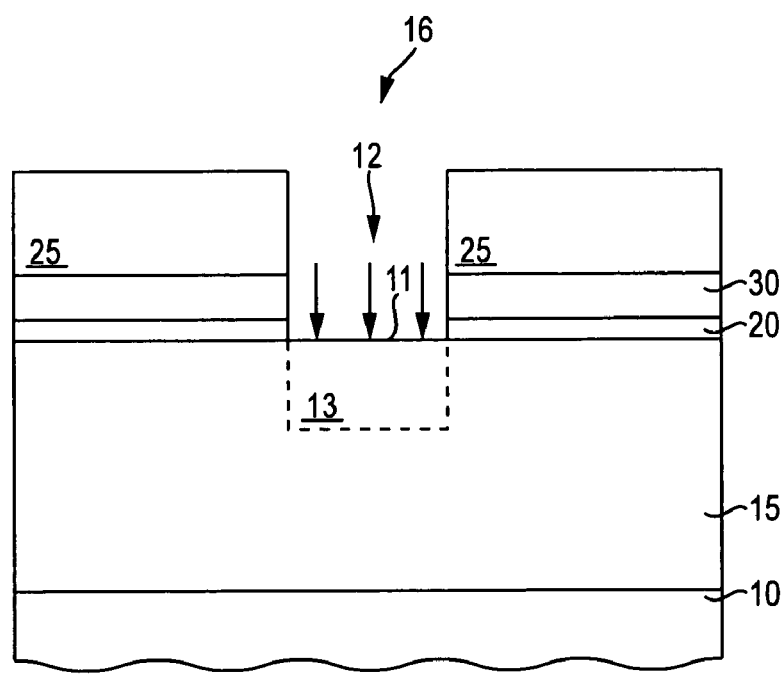
FIG. 3 is a cross-sectional view of the representative substrate of FIG. 2, at a stage of processing subsequent to that shown in FIG. 2.

Referring now to FIG. 3, a first ion field implantation is performed in opening 12. Since region 15 is formed as a p-well 15 in the exemplary structural embodiments (FIGS. 1A-1E), p-type dopants are used in the first ion field implantation. For instance, boron is implanted through opening 12 into the p-well region 15 to form a p-type doped region 13. P-type doped region 13 is formed to have a higher p-type dopant concentration than the p-type dopant concentration found in surrounding p-well 15.

Figure 4:
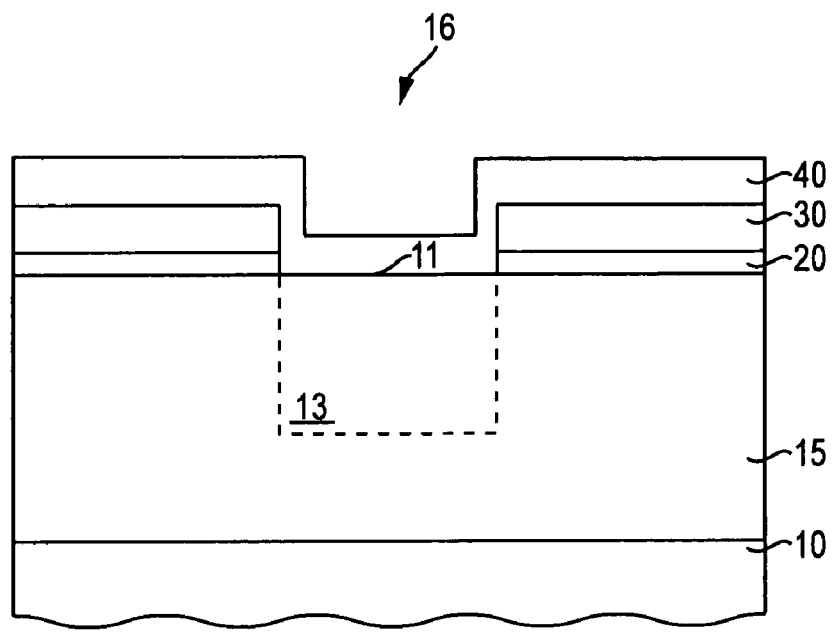
FIG. 4 is a cross-sectional view of the representative substrate of FIG. 2, at a stage of processing subsequent to that shown in FIG. 3.

Referring now to FIG. 4, the mask 25 is removed by wet or dry stripping. A second sacrificial layer 40, such as $Si_3N_4$, is then blanket deposited over the first sacrificial layer 30, pad oxide layer 20, and substrate 10. The second sacrificial layer 40 then undergoes an anisotropic etchback without employing a photolithographic step.

Figure 5:
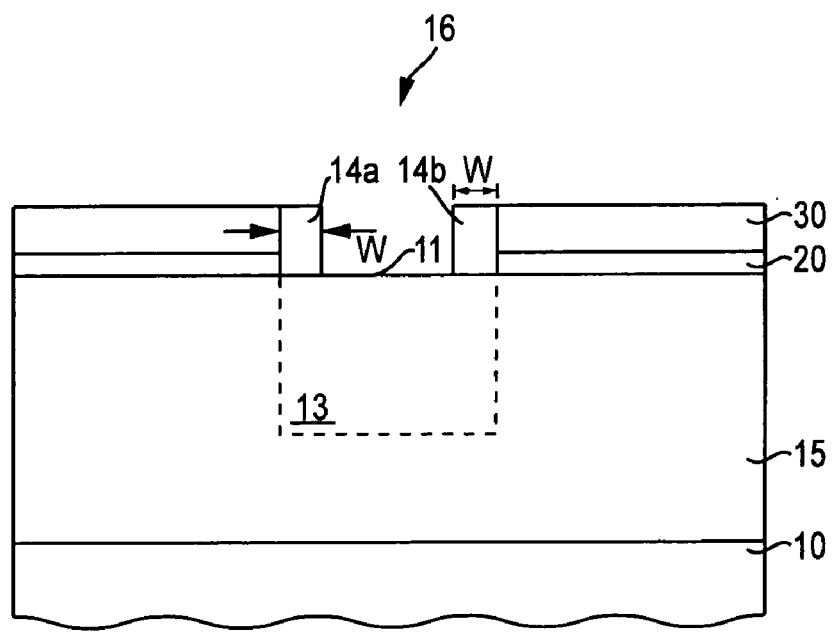
FIG. 5 is a cross-sectional view of the representative substrate of FIG. 2, at a stage of processing subsequent to that shown in FIG. 4.

Referring now to FIG. 5, portions of layer 40 are removed to expose surface 11. In essence, the second sacrificial layer 40 is completely removed except for the remaining portions 14a and 14b. In other words, the second sacrificial layer 40 remains only to the extent such that spacers 14a and 14b are formed over surface 11 of substrate 10. The spacer widths w determine the width of the trench isolation region 16.

Figure 6A:
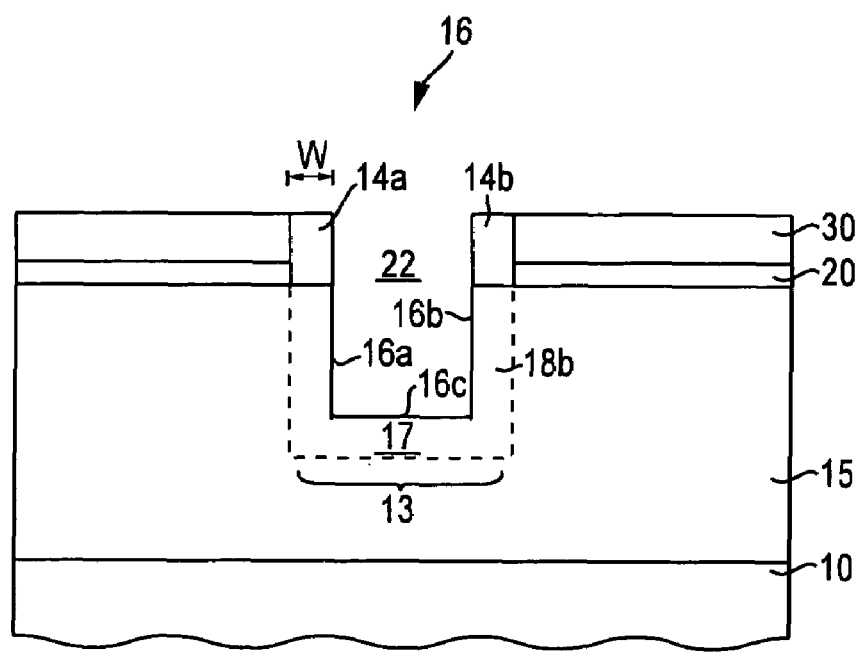
FIG. 6A is a cross-sectional view of the representative substrate of FIG. 2, at a stage of processing subsequent to that shown in FIG. 5 in accordance with one exemplary embodiment of the invention.

Referring now to FIG. 6A, the trench isolation region 16 is formed by using the spacers 14a and 14b as a mask. Again, the width w of spacers 14a and 14b determines the width of the trench isolation region 16. P-type doped region 13 is etched through opening 22 using conventional techniques. For instance, an anisotropic etch such as a plasma or reactive ion etch process can be used. Trench isolation region 16 is formed to have a first trench sidewall 16a, second trench sidewall 16b, and bottom portion 16c.

In the exemplary fabrication embodiment illustrated in FIG. 6A, the remaining dopants from p-type doped region 13 form doped regions 18a, 18b, and 17 after the trench isolation region 16 has been etched. Regions 18a, 18b, and 17 have an impurity dopant concentration higher than the impurity dopant concentration found in the p-well region 15. Doped region 18a is formed adjacent to first trench sidewall 16a. Doped region 18b is formed adjacent to second trench sidewall 16b. Doped region 17 is formed adjacent to the bottom portion 16c of the trench 16. The p-well region 15 is now separated from the trench sidewalls and bottom 16a, 16b, and 16c, by the more highly-doped p-type regions 18a, 18b and 17.

In this exemplary embodiment, more higher doped regions 18a, 18b, and 17 are adjacent the respective trench sidewalls and bottom 16a, 16b, and 17c, and also have the same p-type dopant concentration. However, the location and depth of the etch to form the trench isolation region 16 can be varied such that: 1) only one sidewall of the trench, i.e., 16a, is adjacent a doped region, i.e., 18a, as illustrated in FIG. 1C; 2) only one sidewall i.e., 16a and the bottom portion 16c of the trench 16 are adjacent respective doped regions, i.e., 18a and 17, as illustrated in FIG. 1D; or 3) only sidewalls 16a and 16b are adjacent respective doped regions 18a, 18b, as illustrated in FIG. 1E.

Figure 6B:
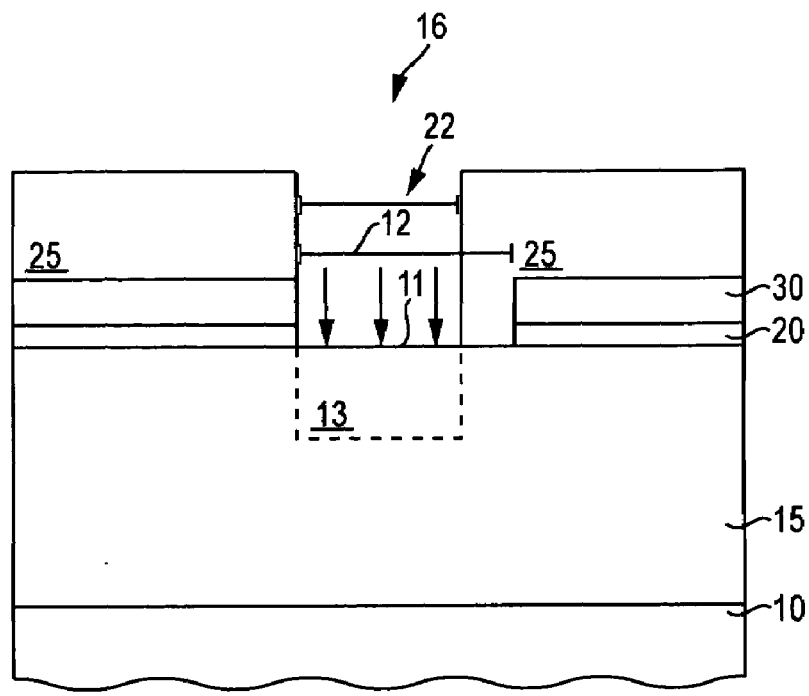
FIG. 6B is a cross-sectional view of a representative substrate undergoing the formation of a trench isolation region, performed in accordance with another exemplary method embodiment of the invention.

For instance, to form the exemplary structure depicted in FIG. 1C, the first sacrificial layer 30 and the pad oxide layer 20 are etched through an opening in mask 25 as illustrated in FIG. 6B. The etching process is conducted until the surface 11 of the substrate 10 is reached. This forms opening 22. The etching process does not etch into the substrate 10. As illustrated in FIG. 6B, a portion of mask 25 is formed over the edges of layer 30 and layer 20 to define a doped region 13 smaller than opening 12 of FIG. 2.

To form doped region 13, a first ion field implantation is performed in opening 12. Typically, boron is implanted through opening 12 into the p-well region 15 to form a p-type doped region 13. P-type doped region 13 is formed to have a higher p-type dopant concentration than the p-type dopant concentration found in surrounding p-well 15.

Figure 6C:
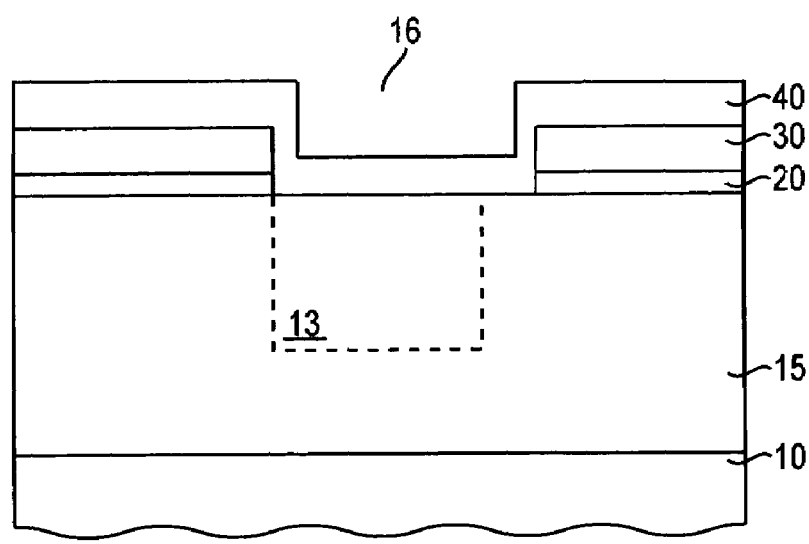
FIG. 6C is a cross-sectional view of the representative substrate of FIG. 6A, at a stage of processing subsequent to that shown in FIG. 6B in accordance with one exemplary embodiment of the invention.

The mask 25 is removed by wet or dry stripping and a second sacrificial layer 40 is blanket deposited over the first sacrificial layer 30, pad oxide layer 20, and substrate 10 as illustrated in FIG. 6C. The second sacrificial layer 40 then undergoes an anisotropic etchback without employing a photolithographic step.

Figure 6D:
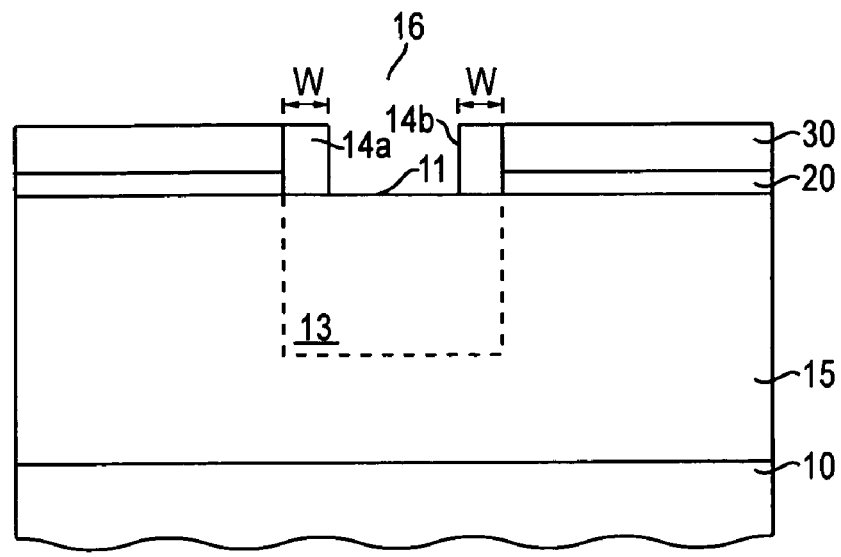
FIG. 6D is a cross-sectional view of the representative substrate of FIG. 6A, at a stage of processing subsequent to that shown in FIG. 6C in accordance with one exemplary embodiment of the invention.

Referring now to FIG. 6D, portions of layer 40 are removed to expose surface 11 such that spacers 14a and 14b are formed over surface 11 of substrate 10. The spacer widths w determine the width of the trench isolation region 16. In this exemplary variant, the trench isolation region 16 is formed by employing spacers 14a and 14b as a mask as FIG. 6D illustrates.

Figure 6E:
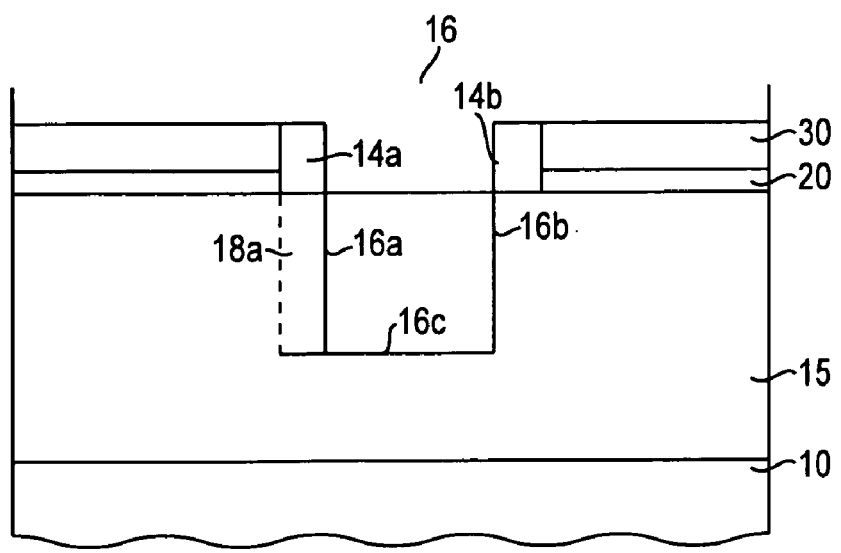
FIG. 6E is a cross-sectional view of the representative substrate of FIG. 6A, at a stage of processing subsequent to that shown in FIG. 6D in accordance with one exemplary embodiment of the invention.

The trench 16 is then formed by etching into the substrate 10 and to the bottom of doped region 13 as illustrated in FIG. 6E. Trench isolation region 16 is thus formed to have a first trench sidewall 16a, second trench sidewall 16b, and bottom portion 16c. In this variant, the remaining dopants from p-type doped region 13 form doped region 18a adjacent sidewall 16a after the trench isolation region 16 has been etched. Doped region 18a has an impurity dopant concentration higher than the impurity dopant concentration found in the p-well region 15. Trench sidewall 16b is not adjacent to a doped region 18b. Accordingly, the exemplary structure in FIG. 1C is formed in this manner.

It should also be appreciated that the exemplary methods described in FIGS. 6B-6E, can also be used to form a doped region 18b adjacent sidewall 16b after the trench isolation region 16 has been etched. In this exemplary variant, the remaining dopants from p-type doped region 13 form doped region 18b which has an impurity dopant concentration higher than the impurity dopant concentration found in p-well region 15. Trench sidewall 16a would not adjacent to a doped region 18a.

Figure 6F:
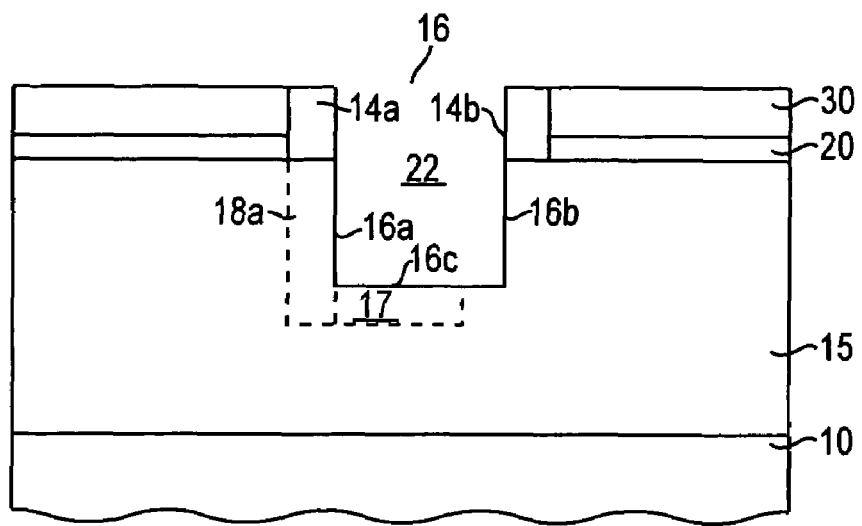
FIG. 6F is a cross-sectional view of the representative substrate of FIG. 6A, at a stage of processing subsequent to that shown in FIG. 6E in accordance with one exemplary embodiment of the invention.

In another exemplary method variant illustrated in FIG. 6F, the trench isolation region 16 is formed by using spacers 14a and 14b as a mask as illustrated in FIG. 6D. In this exemplary variant, however, P-type doped region 13 and substrate 10 are etched through opening 22; but, the etch does not extend to the bottom of doped region 13. Trench isolation region 16 is formed to have a first trench sidewall 16a, second trench sidewall 16b, and bottom portion 16c with trench sidewall 16a and bottom portion 16c adjacent the more highly doped regions 18a and 17 as illustrated in FIG. 6F.

In this optional variant, the remaining portions from p-type doped region 13 form doped regions 18a and 17 after the trench isolation region 16 has been etched. Doped regions 18a and 17 have an impurity dopant concentration higher than the impurity dopant concentration found in the p-well region 15. Region 17 is formed to be not self-aligned to trench sidewall 16b. However, additional ion implantations could be performed to extend region 17 to be self-aligned to trench sidewall 16b.

It should be appreciated that in FIGS. 6A-6G, one or more of the doped regions 18a, 18b, and 17, can also selectively receive additional dopants after trench etching and prior to an oxide fill, to increase the dopant concentration, if desired.

Figure 6G:
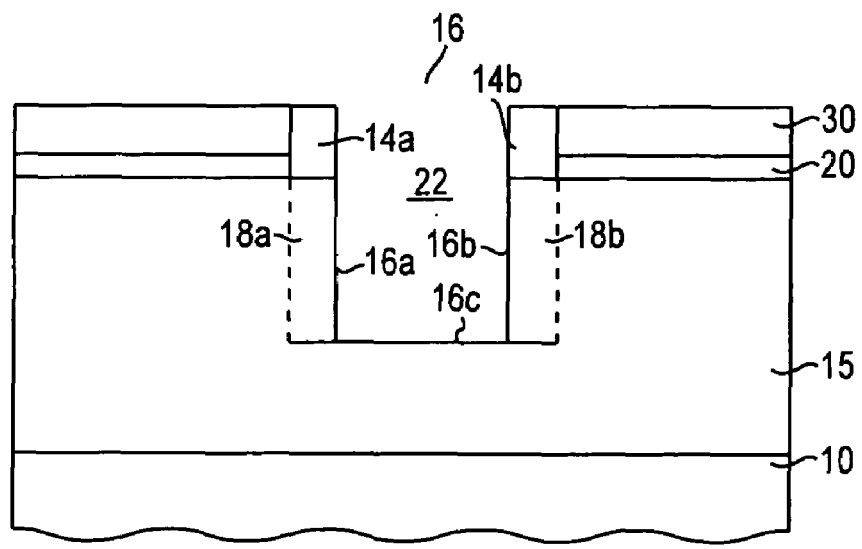
FIG. 6G is a cross-sectional view of the representative substrate of FIG. 2, at a stage of processing subsequent to that shown in FIG. 5 in accordance with another exemplary embodiment of the invention.

As shown in FIGS. 1A and 6A, doped region 17 is formed to overlap portions of doped regions 18a and 18b. In another exemplary fabrication embodiment, however, the trench isolation region 16 can be extended such that doped regions 18a and 18b are adjacent respective trench sidewalls 16a and 16b, and do not overlap with doped region 17 as illustrated in FIG. 6G.

In this optional method variant, the trench isolation region 16 is formed by using spacers 14a and 14b as a mask. In this variant, however, the p-type region 13 and substrate 10 are etched through opening 22 down to the bottom of doped region 13. The remaining dopants from p-type doped region 13 form doped regions 18a and 18b, but after trench etching there is no remaining portion of doped region 13 below the trench 16. A doped region 17, however, can be formed by doping through the opening 22 after the trench isolation region 16 has been etched. In this case, however, layer 30 should be thick enough to block the implant in the non-trench area.

Figure 6H:
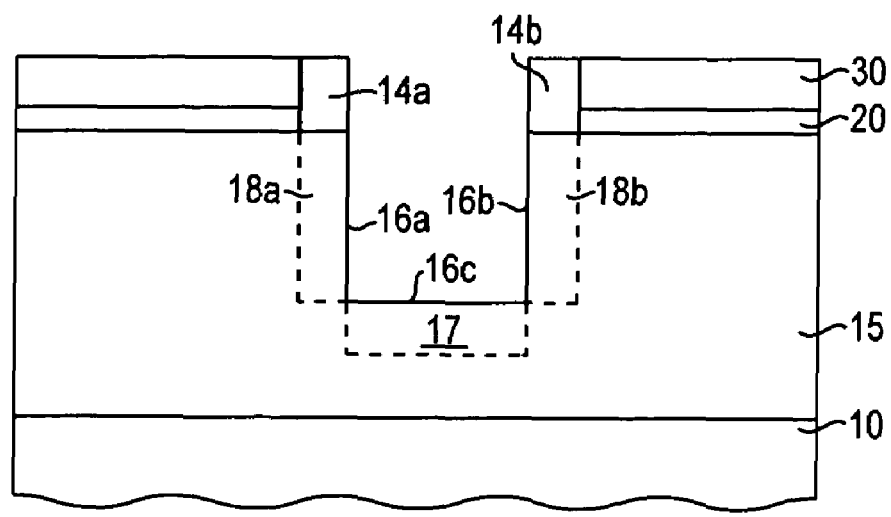
FIG. 6H is a cross-sectional view of the representative substrate of FIG. 2, at a stage of processing subsequent to that shown in FIG. 5 in accordance with another exemplary embodiment of the invention.

For instance, in FIG. 6H, the doped region 17 can be subsequently formed by doping the bottom portion 16c of the trench isolation region 16 with p-type dopants using the first sacrificial layer 30 as a mask through opening 22. In this exemplary fabrication embodiment, doped region 17 is formed deeper in substrate 10 and p-well 15 than doped regions 18a and 18b. Doped region 17 is also formed self-aligned to doped regions 18a and 18b. As shown in FIG. 6H, doped region 17 does not overlap doped regions 18a and 18b. Doped region 17 can be formed to have the same or different dopant concentration from doped regions 18a and 18b.

Figure 7:
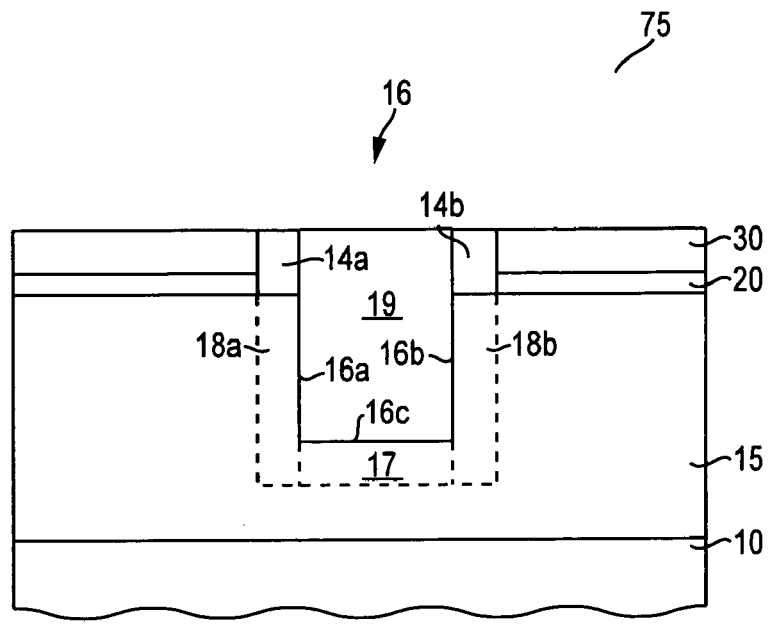
FIG. 7 is a cross-sectional view of the representative substrate of FIG. 2, at a stage of processing subsequent to that shown in FIG. 6A.

Referring now to FIG. 7, which is a process step subsequent to the FIG. 6A exemplary fabrication step, the trench isolation region 16 is filled with an oxide material 19. The trench isolation region 16 can be filled with a dielectric material, which may be an oxide material, for example a silicon oxide such as SiO, $SiO_2$, HDP oxide, a thermally grown oxide, oxynitride, a nitride material such as silicon nitride, silicon carbide, a high temperature polymer, or other suitable dielectric materials. The dielectric may be also formed of any combination of oxide/nitride, nitride/oxide and oxide/nitride/oxide materials.

After the oxide material 19 is deposited, an anneal process can be performed to densify the oxide material 19 prior to planarization. The anneal process can also serve to activate dopant implants. Subsequently, the top surface of the semiconductor wafer 75 is planarized by an etchback process which can include, for example, a chemical-mechanical polish (CMP) or any other technique known in the art. The CMP process is conducted until the surface of the first sacrificial layer 30 is revealed, and/or until the substrate's 10 surface is revealed.

Figure 8:
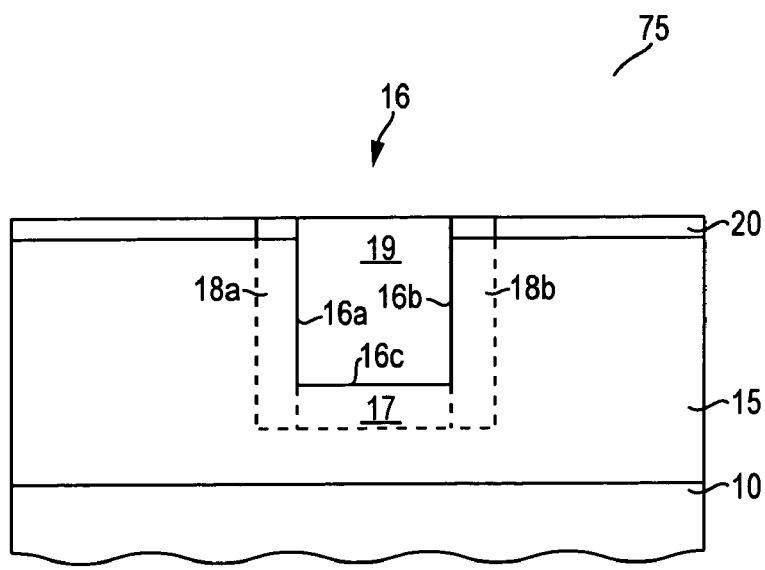
FIG. 8 is a cross-sectional view of the representative substrate of FIG. 2, at a stage of processing subsequent to that shown in FIG. 7.

Referring now to FIG. 8, remaining portions of the first sacrificial layer 30 and spacers 14a and 14b are removed if the CMP process has not previously removed these portions. For instance, if the first sacrificial layer 30 and spacers 14a and 14b comprise silicon nitride, phosphoric acid can be used to etch away the remaining portions.

At this point, additional processes can be performed using techniques known in the art to complete an integrated circuit (IC) that includes active semiconductor regions separated by a trench isolation region 16. For instance, after forming the trench isolation region 16 of FIGS. 1A-1E, further steps to create a functional pixel memory cell or other electronic device or circuit may be carried out. The same trench filling and planarization processes described above with references to FIGS. 7 and 8, can also be applied to the method variations described above with references to FIGS. 6B-6H.

Figure 9:
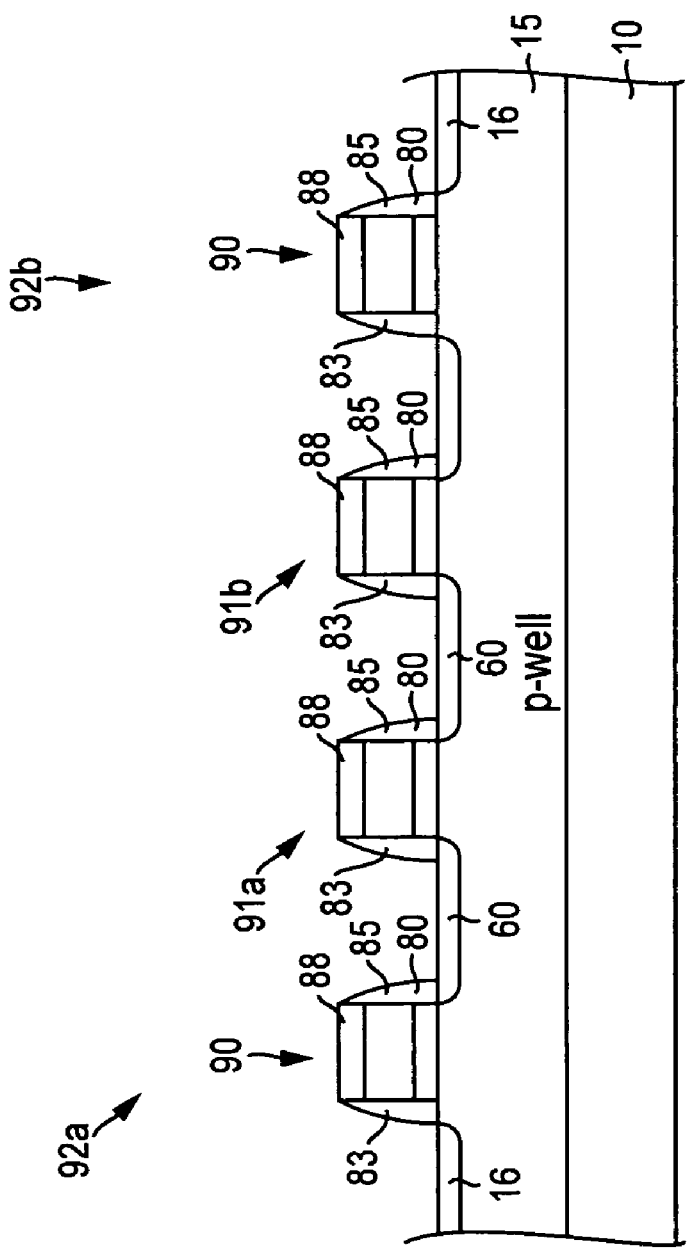
FIG. 9 is a cross-sectional view of a portion of a conventional memory DRAM device with a trench isolation region formed in accordance with a method of the invention.

FIG. 9 depicts a conventional memory cell construction for a DRAM at an intermediate stage of the fabrication at which the cell access transistors are formed, and in which a trench isolation region, such as region 16 as depicted in any one of FIGS. 1A-1E, has been formed in a substrate 10 and p-well 15 according to the exemplary methods of the present invention disclosed in FIGS. 2-8.

As shown in FIG. 9, a pair of memory cells 92a and 92b, having respective access transistors 91a and 91b, are formed within a p-well 15 of substrate 10. The transistors 91a and 91b of the cells 92a and 92b, are surrounded by the trench isolation regions 16 that provide electrical and physical isolation. N-type active regions 60 are provided in the doped p-well 15 of substrate 10 (for NMOS transistors) and the pair of access transistors 91a, 91b have respective gate stacks, each of which includes: an oxide layer 80, a conductive layer 85, such as polysilicon, nitride spacers 83, and a nitride cap 88. Next, as known in the art, polysilicon plugs, capacitors, metal contacts and bit lines could be formed in or on, one or more insulating layers provided over the FIG. 9 structure using well-known techniques to produce operative DRAM cells.

Figure 10:
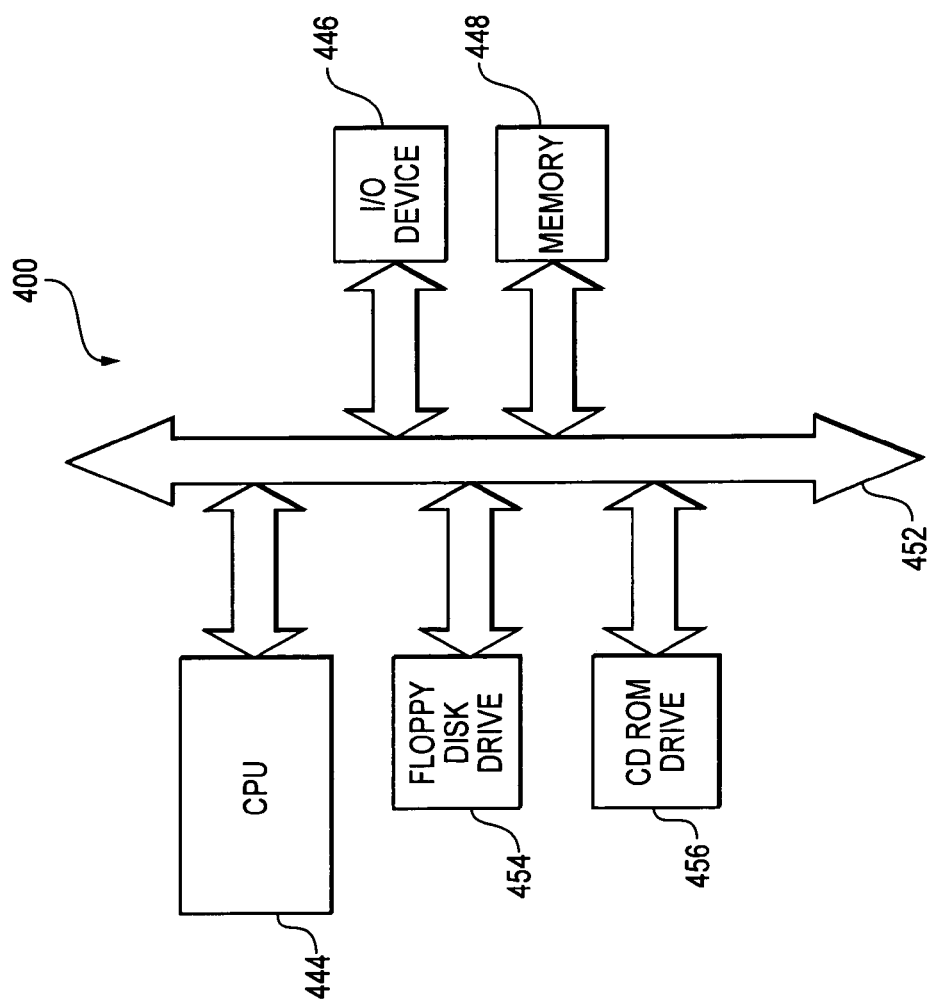
FIG. 10 is an illustration of a computer system having a memory cell with a trench isolation region formed in accordance with a method of the invention.

The memory cells 92a and 92b of FIG. 9, could be part of a typical processor system 400 illustrated in FIG. 10. A processor system, such as a computer system, generally comprises a central processing unit (CPU) 444, such as a microprocessor, which communicates with an input/output (I/O) device 446 over a bus 452. A memory 448, having at least one trench isolation region 16 fabricated according to the present invention, also communicates with the CPU 444 over bus 452. In addition, the CPU 444 may itself contain regions isolated with at least one trench isolation region 16 fabricated according to the present invention.

In the case of a computer system 400, the system 400 may include additional peripheral devices such as a floppy disk drive 454, and a compact disk (CD) ROM drive 456 that also communicate with CPU 444 over the bus 452. Memory 448 is preferably constructed as an integrated circuit, which includes trench isolation regions 16 formed as previously described with respect to FIGS. 1-9. The memory 448 may be combined with a processor, such as a CPU, digital signal processor or microprocessor, with or without memory storage, in a single integrated circuit chip.

In another exemplary structural embodiment, trench isolation regions can be formed adjacent to a pinned photodiode region within a pixel cell of a CMOS imager as illustrated in FIGS. 11A-11D.

FIGS. 11A-11D illustrate a cross-sectional view of an exemplary CMOS image pixel cell structure 200 employing trench isolation regions 150, formed in accordance with the present invention, adjacent a photosensor in the form of a pinned photodiode 188. It should be noted that the trench isolation regions 150 can be used in connection with any pixel architecture having a photosensor which needs associated isolation.

FIGS. 11A-11D illustrate a multi-layered transfer transistor gate stack 130 formed over a semiconductor substrate 110. The transfer transistor gate stack 130 comprises a first gate oxide layer 131, conductive layer 132, and second insulating layer 133. If desired, a silicide layer (not shown) may be also formed in the multi-layered gate stack 130 between the conductive layer 132 and the second insulating layer 133. An insulating oxide or nitride layer 134 can be used to form sidewall spacers (not shown) on the sides of the transfer transistor gate stack 130 at an earlier or later processing step.

Still referring to FIGS. 11A-11D, the first trench isolation region 150a is formed at least partially within p-well 194 and n-well 192, substrate 110, and doped region 113. The second trench isolation region 150b is formed within p-well 194, substrate 110, and doped region 113. Doped regions 113 are more highly doped than the surrounding p-type substrate 110 and p-wells 194. The first and second trench isolation regions 150a and 150b of FIGS. 11A-11D have a bottom portion 116c, first trench sidewall portion 116a, and second trench sidewall portion 116b.

Figure 11A:
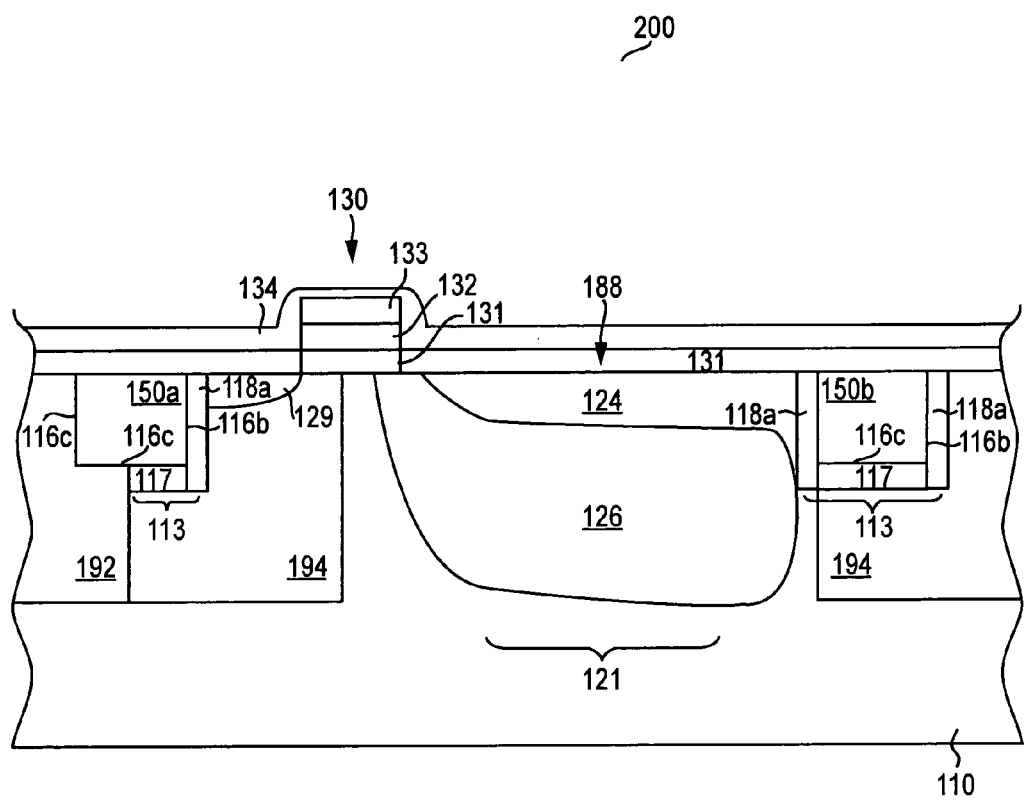
FIG. 11A is a cross-sectional view of a CMOS image pixel cell illustrating a photodiode and first and second trench isolation regions formed in accordance with one exemplary structural embodiment of the invention.

In one exemplary structural embodiment, illustrated in FIG. 11A, the second trench isolation region 150b has doped regions 118a, 118b, and 117 in substrate 110. The doped regions 118a, 118b, and 117 are located adjacent to respective portions 116a, 116b, and 116c of the second trench isolation region 150b. Doped regions 118a, 118b, and 117 contain p-type dopants in a higher dopant concentration than the p-type dopant concentration in p-well 194 and in p-type surface layer 124 of the photodiode 188.

For the first trench isolation region 150a, doped regions 118b and 117 of substrate 110 are located adjacent to respective portions 116b and 116c of the first trench isolation region 150a. Doped regions 118b and 117 contain p-type dopants in a higher dopant concentration than the p-type dopant concentration in p-well 194. As illustrated in FIG. 11A, doped region 117 does not extend into n-well region 192; but, remains adjacent only to portions of the first trench isolation region 150a present in p-well 194.

Figure 11B:
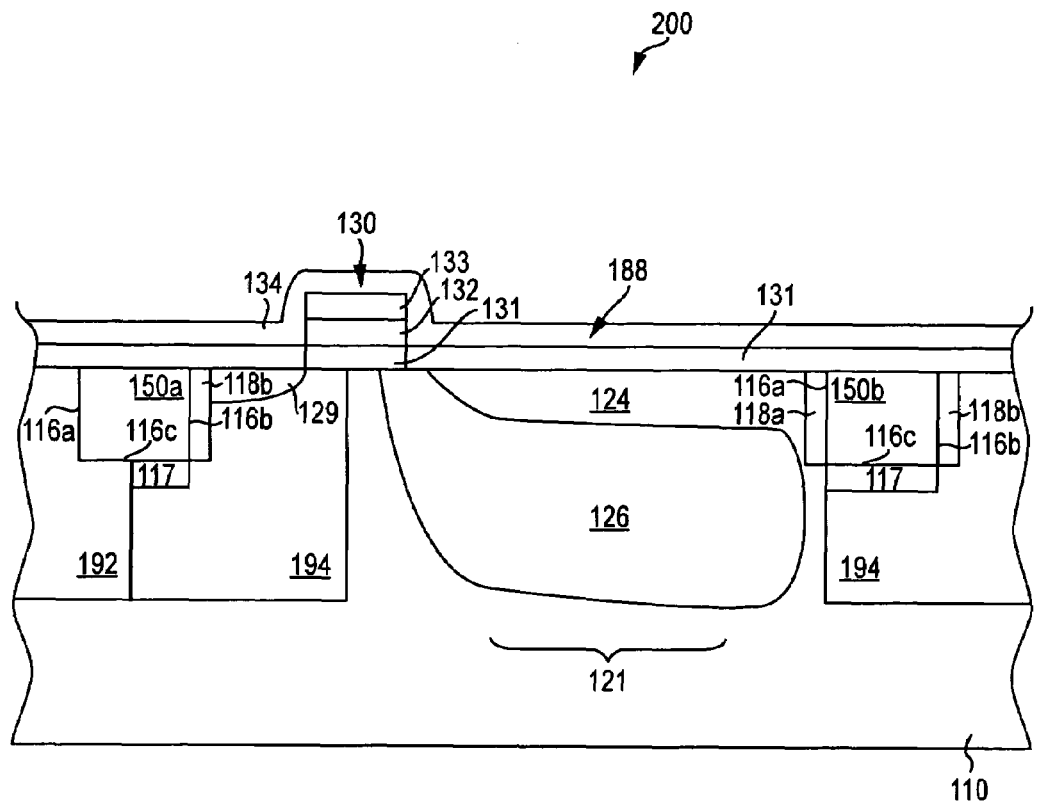
FIG. 11B is a cross-sectional view of a CMOS image pixel cell illustrating a photodiode and first and second trench isolation regions formed in accordance with another exemplary structural embodiment of the invention.

In the exemplary structural embodiment of FIG. 11A, doped region 117 is formed to overlap and have the same depth as doped regions 118a and 118b for the second trench isolation region 150b. In another variant, doped region 117 is formed deeper in substrate 110 than doped regions 118a and 118b for the second trench isolation region 150b and does not overlap doped regions 118a and 118b, which is illustrated in FIG. 11B.

Similarly, for the first trench isolation region 150a, doped region 117 is formed to overlap and have the same depth as doped region 118b in FIG. 11A. In another variant, however, doped region 117 is formed deeper in substrate 110 than doped region 118b for the first trench isolation region 150a and does not overlap doped region 118b, which is also illustrated in FIG. 11B.

Figure 11C:
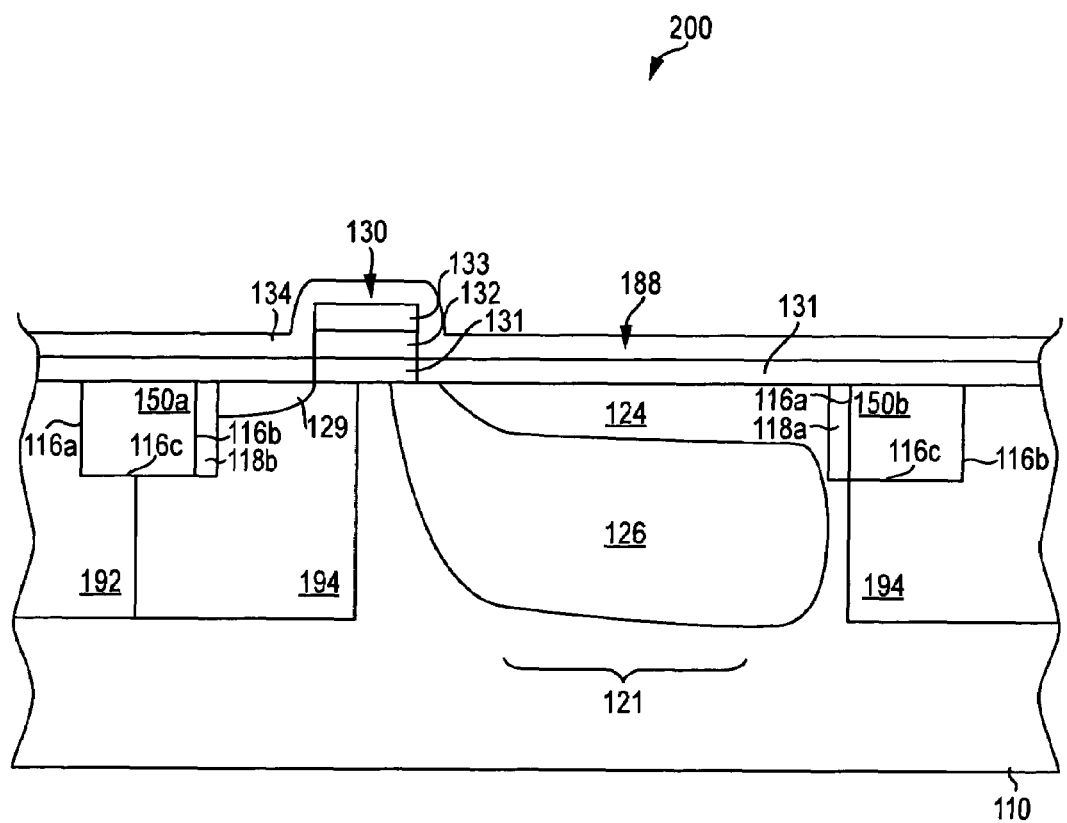
FIG. 11C is a cross-sectional view of a CMOS image pixel cell illustrating a photodiode and first and second trench isolation regions formed in accordance with another exemplary structural embodiment of the invention.

In still another variant, only one trench sidewall i.e., 116a, is formed adjacent a corresponding more highly doped region i.e., 118a, as illustrated in FIG. 11C for the second trench isolation region 150b. For the first trench isolation region 150a, only one trench sidewall i.e., 116b, is formed adjacent a corresponding more highly doped region i.e., 118b, while the other trench sidewall 116a is adjacent n-well 192, as illustrated in FIG. 11C for the first trench isolation region 150a. It should be noted that in FIG. 11C, the first and second trench isolation regions 150a and 150b have bottom portions 116c which are not adjacent to a doped region. It should be appreciated, however, that the second trench isolation region 150b should preferably have the second trench sidewall i.e., 116b, formed adjacent to a more higher doped region 118b. This is the case since the second trench isolation region 150b is formed in p-well 194.

Figure 11D:
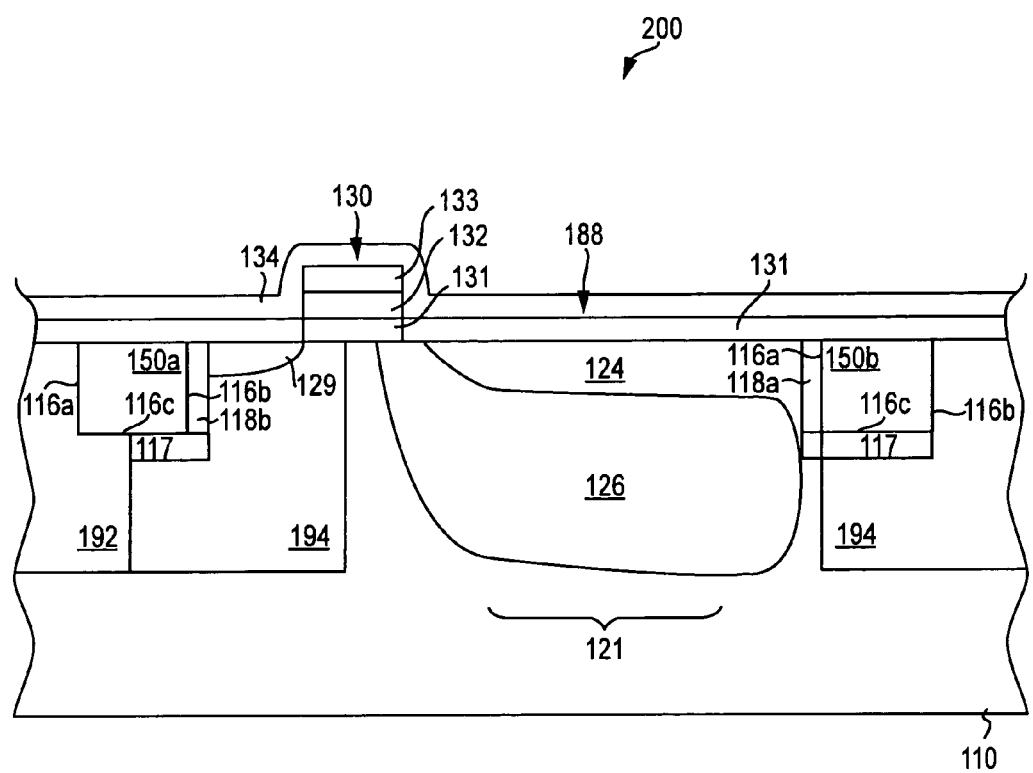
FIG. 11D is a cross-sectional view of a CMOS image pixel cell illustrating a photodiode and first and second trench isolation regions formed in accordance with another exemplary structural embodiment of the invention.

In still another variant, illustrated in FIG. 11D, the second trench isolation region 150b has only one trench sidewall i.e., 116a, and the bottom portion 116c which are formed adjacent to a corresponding more highly doped region i.e., 118a and 117. The other trench sidewall 116b for the second trench isolation region 150b is adjacent to p-well 194. For the first trench isolation region 150a, only one trench sidewall i.e., 116b, and the bottom portion 116c are formed adjacent to a corresponding more highly doped region i.e., 118b and 117, while the other trench sidewall 116a is adjacent n-well 192, as illustrated in FIG. 11D. Again, it should be appreciated, that the second trench isolation region 150b should preferably have the second trench sidewall i.e., 116b, formed adjacent to a more higher doped region 118b. This is the case since the second trench isolation region 150b is formed in p-well 194.

The doped regions 118a, 118b, and 117 of FIGS. 11A-11D comprise p-type dopants since well 194 is a p-well. Doped regions 118a, 118b and 117 have a higher p-type dopant concentration than the surrounding p-type doped regions in substrate 110, such as p-type well 194 and p-type pinned surface region 124. When the trench isolation region, such as the first trench isolation region 150a, is adjacent to an n-well region 192, a doped region is not formed in the n-well region 192 even though portions of the first trench isolation region 150a extend into the n-well region 192, as illustrated in FIG. 11A.

FIGS. 11A-11D further illustrate a p-n-p photodiode structure 188 with a p-type pinned surface region 124, n-type region 126, and p-type substrate 110. As noted, in these exemplary structural embodiments, the p-type substrate 110 is a substrate which has been doped with p-type dopants. The p-type substrate 110 can be formed by implantation or using p-epi wafers. Again, the p-type doped regions 118a, 118b and 117 have a higher p-type dopant concentration than p-type substrate 110. P-type doped regions 118a and 118b, however, can have the same or different dopant concentration than p-type doped region 117. Moreover, p-type doped region 118a can have the same or different dopant concentration than p-type doped region 118b, if both doped regions are present.

The n-type region 126 is formed by implanting n-type dopants in the area of the p-type substrate 110 directly beneath the active area of the pixel cell 200. The n-type region 126 forms a photosensitive charge collection region 121 for collecting photogenerated electrons. The p-type pinned surface region 124 is formed by implanting p-type dopants above n-type region 126 and between the transfer gate 130 and second trench isolation region 150b.

The pinned photodiode 188 is self-aligned to the second trench isolation region 150b and to p-well 194 as a result of the p-type dopants present in doped regions 118a, 118b and 117 (FIGS. 11A and 11B) or because of doped region 118a (FIG. 11C), or because of doped regions 118a and 117 (FIG. 11C). In other words, the presence of doped regions 118a, 118b and 117 allows a larger n-type region 126 to be formed up to the doped region 118a of the second trench isolation region 150b. A larger n-type region 126 correlates to an increased charge collection region 121 which yields higher capacitance with reduced dark current. Since doped regions 118a, 118b, and 117 permit the n-type region 126 to be formed closer to the second trench isolation region 150b, region 150b can be employed as a self-aligned mask for forming n-type region 126.

FIGS. 11A-11D also illustrate an n-type floating diffusion region 129 located adjacent to the multi-layered gate stack 130 and to the first trench isolation region 150a, and opposite the n-type region 126 of photodiode 188. The multi-layered transfer gate stack 130 transfers charge accumulated in the charge collection region 121 to the n-type floating diffusion region 129.

Employing the first and second trench isolation regions 150a and 150b of FIGS. 11A-11D, reduces the dark current associated with defects in the trench interface because of their relatively high doping profile adjacent the first and second trench sidewalls 116a, 116b, and/or bottom portion 116c. The high doping profile of doped regions 118a and/or 118b and/or 117, also keeps the depletion region of the photodiode 188 from reaching the trench first and second sidewalls 116a, 116b, and bottom portion 116c. In other words, the first and second trench isolation regions 150a and 150b of FIGS. 11A-11D, can be used to electrically and/or optically isolate adjacent pixels in a pixel array, as well as isolating the pixel array from various other active components formed on an imager integrated circuit.

A method of forming the pixel cell 200 of FIGS. 11A-11D is now described in reference to FIGS. 12-19. FIGS. 12-19 illustrate processing steps according to an exemplary fabrication embodiment of the present invention.

Figure 12:
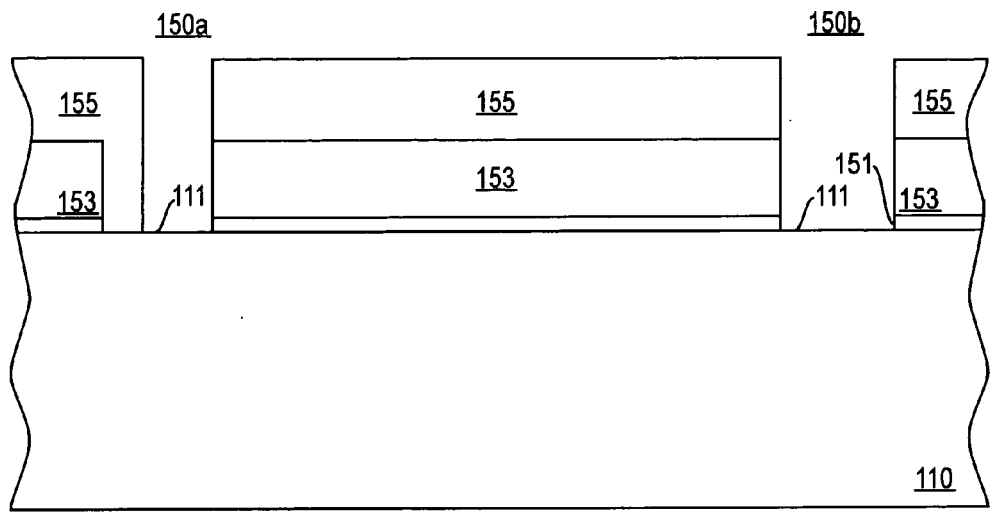
FIG. 12 is a cross-sectional view of a representative substrate of undergoing the formation of first and second trench isolation regions and a photodiode, performed in accordance with a method of one exemplary embodiment of the invention.

Referring now to FIG. 12, a pad oxide film layer 151 is blanket deposited over a semiconductor substrate 110. The pad oxide layer 151 can be formed by deposition or by oxidizing conditions. A first sacrificial layer 153, such as $Si_3N_4$, is blanket deposited over the pad oxide film layer 151. A first mask 155, such as a photoresist layer, is also blanket deposited over the first sacrificial layer 153 and then patterned by any conventional photolithographic technique.

The first sacrificial layer 153 and the pad oxide layer 151 are etched through an opening in the first mask 155 by any conventional etching process. For example, an anisotropic etch or reactive ion etch process can be used. The etching process is conducted until the top surface 111 of the substrate 110 is reached. This forms openings 112a and 112b. It should be appreciated that a portion of mask 155 is formed over the edges of layer 153 and layer 151 to define a doped region 113a smaller than opening 112a, which will later form the first trench isolation region 150a.

Figure 13:
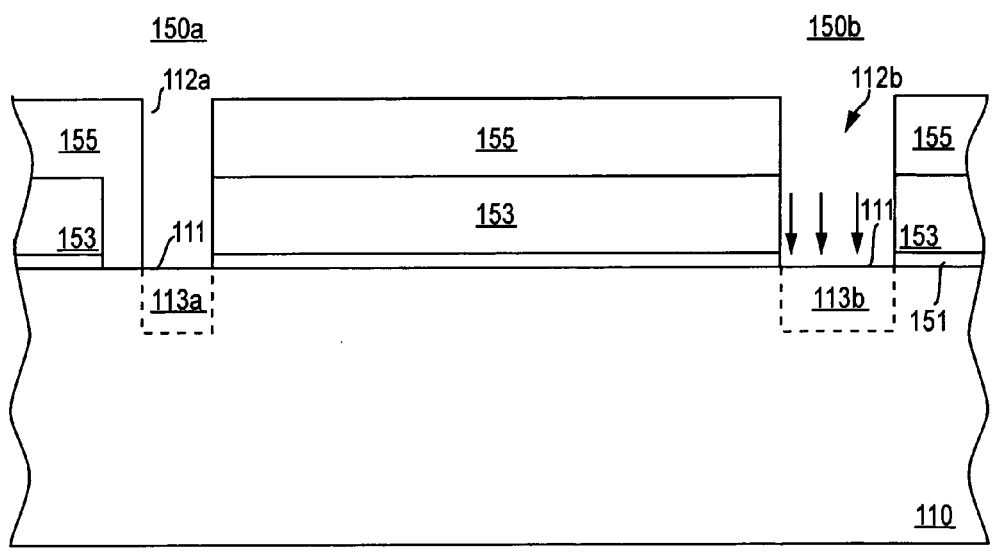
FIG. 13 is a cross-sectional view of the representative substrate of FIG. 12, at a stage of processing subsequent to that shown in FIG. 12.

Referring now to FIG. 13, a first ion field implantation is performed in openings 112a and 112b. Any p-type dopant, such as boron, beryllium, indium or magnesium, among others, can be used in the first ion field implantation if a p-well is to be formed beneath the first and second trench isolation regions 150a and 150b. The p-type dopants are implanted through openings 112a and 112b into the substrate 110 to form p-type doped regions 113a and 113b. P-typed doped region 113a is formed to be smaller than p-type doped region 113b.

Figure 13A:
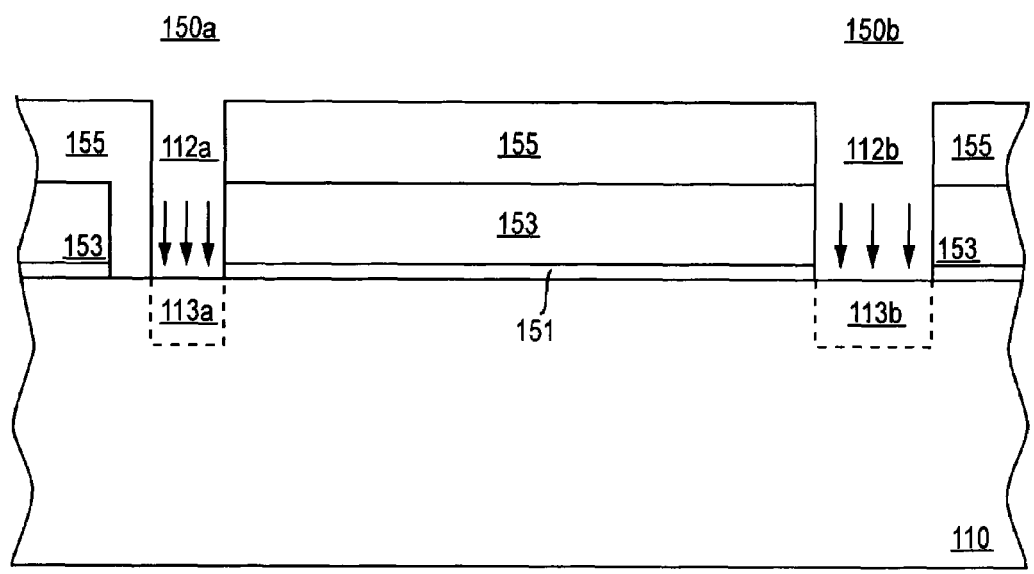
FIG. 13A is a cross-sectional view of a representative substrate of undergoing the formation of first and second trench isolation regions and a photodiode, performed in accordance with a method of another exemplary embodiment of the invention.

In an alternative method embodiment, illustrated in FIG. 13A, a pad oxide film layer 151 is blanket deposited over a semiconductor substrate 110. A first sacrificial layer 153, such as $Si_3N_4$, is blanket deposited over the pad oxide film layer 151. A first mask 155, such as a photoresist layer, is also blanket deposited over the first sacrificial layer 153, and then patterned by any conventional photolithographic technique.

As illustrated in FIG. 13A, a portion of mask 155 is formed over the edges of layer 153 and layer 151 to define doped regions 113a and 113b smaller than openings 112a and 112b, in both predefined areas where the first and second trench isolation regions 150a and 150b are to be formed. The etching process is conducted until the top surface 111 of the substrate 110 is reached. This forms openings 112a and 112b. At this point, p-type dopants are implanted through openings 112a and 112b into the substrate 110 to form p-type doped regions 113a and 113b which are smaller than openings 112a and 112b. Applying this step will form the exemplary structures of FIGS. 11C and 11D.

Figure 14:
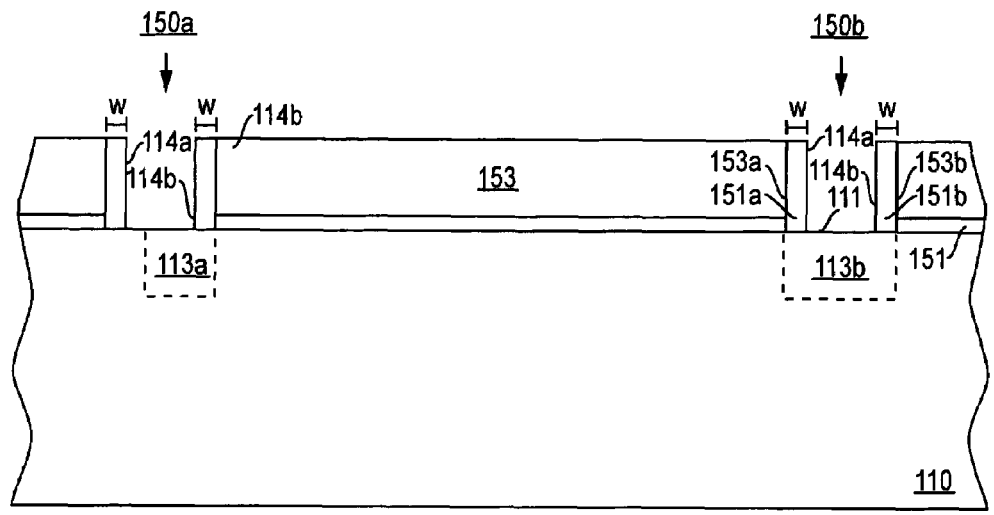
FIG. 14 is a cross-sectional view of the representative substrate of FIG. 13, at a stage of processing subsequent to that shown in FIG. 13.

Referring now to FIG. 14, the first mask 155 is removed by wet or dry stripping. A second sacrificial layer 154, such as $Si_3N_4$, is then blanket deposited over the first sacrificial layer 153, pad oxide layer 151, and substrate 110 (not illustrated). The second sacrificial layer 154 (not illustrated) then undergoes an anisotropic etchback without employing a photolithographic step.

Portions of layer 154 are removed to expose surface 111. In essence, the second sacrificial layer 154 is completely removed except for the remaining portions 114a and 114b. In other words, the second sacrificial layer 154 remains only to the extent such that spacers 114a and 114b are formed over surface 111 of substrate 110. The spacer widths w determine the widths of the trench isolation regions 150a and 150b.

It should be noted that dopants can be implanted into the bulk substrate 110 to form n-type wells and p-type wells, such as p-type wells 194 and n-well 192 illustrated in FIGS. 11A-11D. The p-wells 194 are formed to have a first p-type dopant concentration. The formation of p-wells 194 can occur at any stage during pixel cell's 200 formation. For purposes of a simplified description, p-wells 194 and n-well 192, are formed before the formation of the first and second trench isolation regions 150a and 150b. P-wells 194 and n-well 192, however, can be formed after the formation of the first and second trench isolation regions 150a and 150b.

Figure 15:
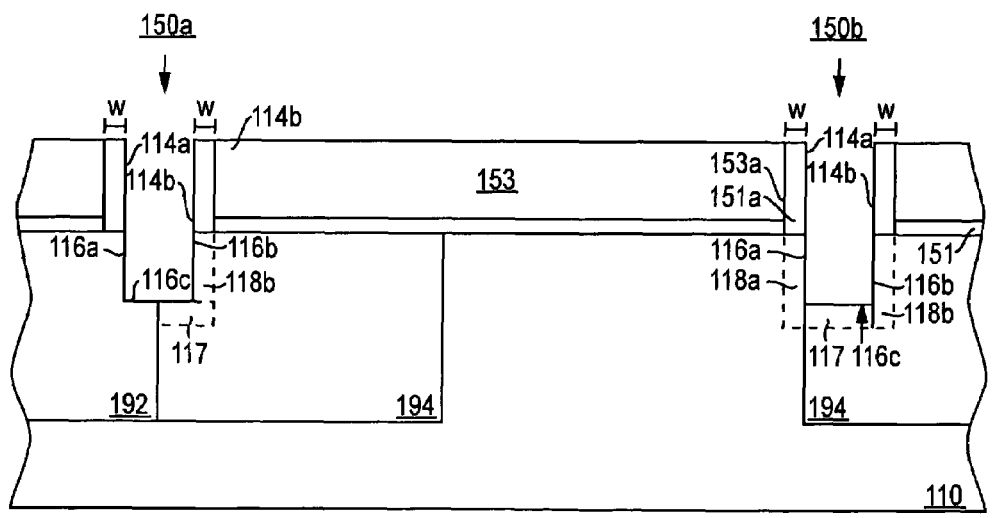
FIG. 15 is a cross-sectional view of the representative substrate of FIG. 13, at a stage of processing subsequent to that shown in FIG. 14 in accordance with one exemplary embodiment of the invention.

Referring now to FIG. 15, the first and second trench isolation regions 150a and 150b are formed by using the spacers 114a and 114b as a mask. P-type doped regions 113a and 113b and substrate 110 are etched away using conventional techniques. For instance, an anisotropic etch such as a plasma or reactive ion etch process can be used. The first and second trench isolation regions 150a and 150b are formed to have a first trench sidewall 116a, second trench sidewall 116b, and bottom portion 116c.

In the exemplary method embodiment illustrated in FIG. 15, the remaining p-type dopants from p-type doped region 113b forms doped regions 118a, 118b, and 117 after the second trench isolation region 150b has been etched. Doped region 118a is formed adjacent to first trench sidewall 116a for the second trench isolation region 150b. Doped region 118b is formed adjacent to second trench sidewall 116b for the second trench isolation region 150b. Doped region 117 is adjacent to bottom portion 116c of the second trench isolation region 150b. In other words, the remaining p-type dopants from p-type doped region 113b forms doped regions 118a, 118b and 117 after the second trench isolation region 150b has been etched.

For the first trench isolation region 150a, the remaining p-type dopants from p-type doped region 113a forms doped regions 118b and 117 after the first trench isolation region 150a has been etched. Doped region 118b is formed adjacent to second trench sidewall 116b. Region 118a does not comprise p-type dopants from doped region 113a. Instead, first trench sidewall 116a is adjacent to n-well 192. Doped region 117 is formed adjacent to bottom portion 116c of the first trench isolation region 150a. Doped region 117, however, is not formed in n-well 192. Doped region 117 is only formed underneath portions of the first trench isolation region 150a present in p-well 194. In other words, doped region 117 is formed adjacent to portions of bottom portion 116c of the first trench isolation region 150a. In other words, the remaining p-type dopants from p-type doped region 113a forms doped regions 118b and 117 after the first trench isolation region 150a has been etched.

Figure 15A:
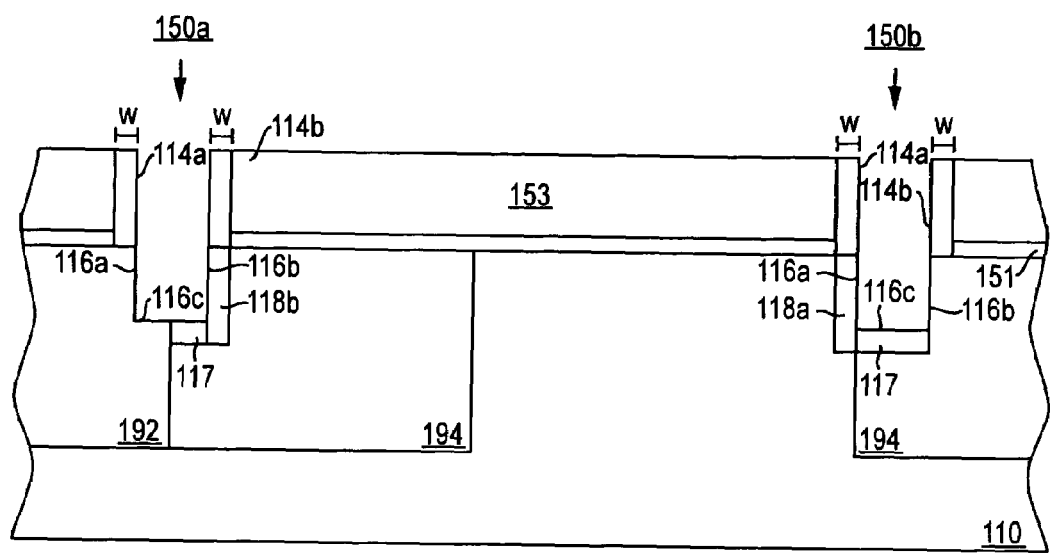
FIG. 15A is a cross-sectional view of the representative substrate of FIG. 13A, at a stage of processing subsequent to that shown in FIG. 13A in accordance with another exemplary embodiment of the invention.

In another exemplary method embodiment which is a subsequent step of FIG. 13A, the formation of the second trench isolation region 150b results in a doped region 118a and 117, as illustrated in FIG. 15A.

Figure 16:
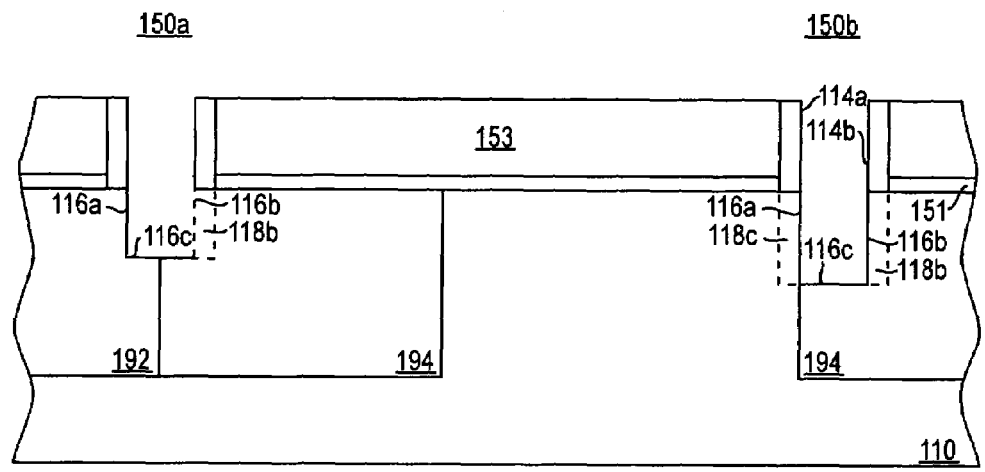
FIG. 16 is a cross-sectional view of the representative substrate of FIG. 13, at a stage of processing subsequent to that shown in FIG. 14 in accordance with an exemplary embodiment of the invention.

Referring back to FIG. 15, at this point, doped regions 118a, 118b and 117 have the same p-type dopant concentration. At subsequent steps, however, doped region 117 and/or doped regions 118a and 118b can be further doped with additional p-type dopants to increase the dopant concentration, if desired. In FIG. 15, doped region 117 is illustrated as overlapping portions of doped region 118a and 118b for the second trench isolation region 150b. Similarly, doped region 117 is illustrated as overlapping a portion of doped region 118b for the first trench isolation region 150a. In another exemplary fabrication embodiment, however, doped region 117 can be formed deeper in substrate 110 than doped regions 118a and 118b such that it does not overlap regions 118a and 118b for the second trench isolation region 150b, as illustrated in FIG. 16. Similarly, doped region 117 can be formed deeper in substrate 110 than doped region 118b such that it does not overlap region 118b, as also illustrated in FIG. 16 for the first trench isolation region 150a.

In the exemplary method embodiment illustrated in FIG. 16, the first and second trench isolation regions 150a and 150b are etched to the bottom of p-type doped regions 113a and 113b leaving no p-type dopants from p-type doped regions 113a and 113b present at the bottom portions 116c of the first and second trench isolation regions 150a and 150b. At this stage in fabrication, regions 117 are not formed.

Regions 117, however, can be subsequently formed by doping the bottom portion 116c of the first and second trench isolation regions 150a and 150b. In this variant, region 117 is formed self-aligned to doped regions 118a and 118b and does not overlap doped regions 118a and 118b for the second trench isolation region 150b. Region 117 is formed deeper in substrate 110 than doped regions 118a and 118b for the second trench isolation region 150b. Similarly, region 117 is formed self-aligned to doped region 118b and does not overlap doped region 118b for the first trench isolation region 150a. Region 117 is formed deeper in substrate 110 than doped region 118b for the first trench isolation region 150a. If doped region 117 is formed for the first trench isolation region 150a in a subsequent step, region 117 can be formed with an extra lithographic step that would mask the n-well 192 from being implanted.

It should also be appreciated that to avoid an extra lithographic step, a blanket implantation can be performed to form a doped region 117 for the first trench isolation region 150a. In this case, doped region 117 would extend to the edge of the first trench sidewall 116a of the first trench isolation region 150a (not illustrated). Thus, in FIG. 11B, the first trench isolation region 150a, would have a doped region 117 that would extend to the first trench sidewall 116a. A doped region 117 formed by blanket implantation for the first trench isolation region 150a is not high enough to compensate for n-well 192 doping. Accordingly, the exemplary structural embodiment of FIG. 11B can be formed using these exemplary methods.

In yet another variant, doped regions 117 are not formed as illustrated in FIG. 11C for the first and second trench isolation regions 150a and 150b. In this exemplary method embodiment, the first and second trench isolation regions 150a and 150b are etched to the bottom of p-type doped regions 113a and 113b, leaving no p-type dopants from p-type doped regions 113a and 113b present at the bottom portions 116c of the first and second trench isolation regions 150a and 150b. Only doped region 118a is formed from the remaining p-type dopants from doped region 113b for the second trench isolation region 150b. Optionally, doped region 118b can also be formed from the remaining p-type dopants from doped region 113b for the second trench isolation region 150b, if desired. Similarly, only doped region 118b is formed from the remaining p-type dopants from doped region 113a for the first trench isolation region 150a. In this embodiment, however, regions 117 are not subsequently formed at a later step.

In still another variant, only a single doped region 117 is formed adjacent to a bottom portion 116c for either the first or second trench isolation regions 150a and 150b. For instance, the second trench isolation region 150b can have a doped region 117 when the second trench isolation region 150b is etched as illustrated in FIG. 15 and not under the first trench isolation region 150a. The first trench isolation region 150a, however, would be etched in a manner such that there is no doped region 117 formed underneath it. Alternatively, a doped region 117 can be formed only underneath portions of the first trench isolation region 150a and not under the second trench isolation region 150b.

Figure 17:
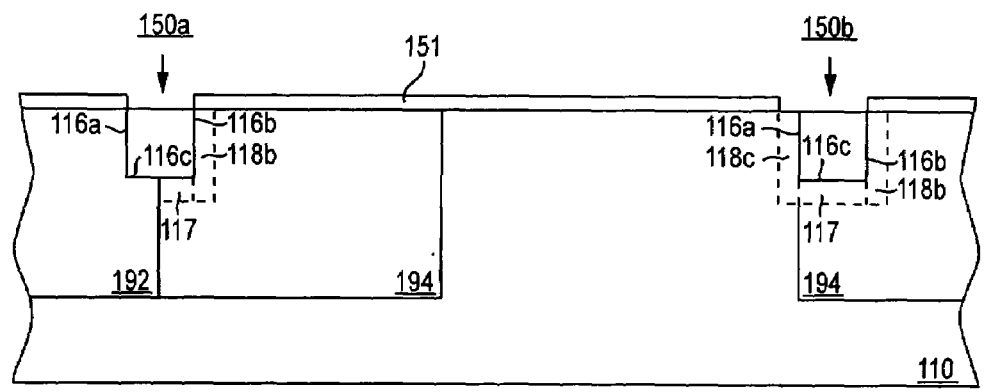
FIG. 17 is a cross-sectional view of the representative substrate of FIG. 13, at a stage of processing subsequent to that shown in FIG. 15.

Referring now to FIG. 17, which is a process step subsequent FIG. 15, remaining portions of the spacers 114a and 114b and first sacrificial layer 153 are removed. For instance, if the sacrificial layer 153 and spacers 114a and 114b comprise silicon nitride, phosphoric acid can be used to etch away the remaining portions.

The first and second trench isolation regions 150a and 150b are filled with a dielectric material, which may be an oxide material, for example a silicon oxide such as SiO, $SiO_2$, a HDP oxide, a thermally grown oxide, oxynitride, a nitride material such as silicon nitride, silicon carbide, a high temperature polymer, or other suitable dielectric materials. The dielectric may be also formed of any combination of oxide/nitride, nitride/oxide and oxide/nitride/oxide materials. The wafer is planarized with known techniques such as CMP, or by dry etch techniques such as resist etch-back to create a planar surface for the first and second trench isolation regions 150a and 150b.

Although FIGS. 12-17 illustrate only a portion of the substrate 110 with first and second trench isolation regions 150a and 150b, it must be understood that the present invention contemplates the simultaneous formation of a plurality of first and second trench isolation regions 150a and 150b. The plurality of first and second trench isolation regions 150a and 150b would be formed at various locations in the p-type substrate 110 to isolate pixels from one another, and to isolate pixel array structures from periphery circuits in an imager device.

Figure 18:
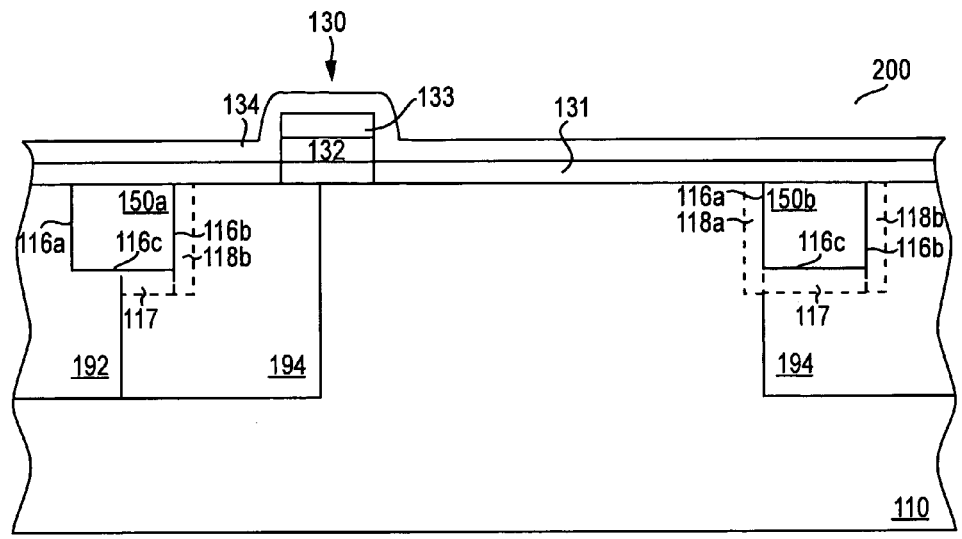
FIG. 18 is a cross-sectional view of the representative substrate of FIG. 13, at a stage of processing subsequent to that shown in FIG. 17.

Referring now to FIG. 18, a multi-layered transfer transistor gate stack 130 is formed over the semiconductor substrate 110. The oxide layer 151 can be removed by techniques well-known in the art, such as a wet etch. A gate oxide layer 131 can then be grown or blanket deposited by conventional methods or techniques. A conductive layer 132 of doped polysilicon or other suitable conductor material, and a second insulating layer 133 are blanket deposited over the gate oxide layer 131. The first and second insulating layers 131, 133 and the conductive layer 132 may be formed by conventional methods.

If desired, a silicide layer (not shown) may be also formed in the multi-layered gate stack 130, between the conductive layer 132 and the second insulating layer 133. Advantageously, the gate structures of all other transistors in the imager circuit design may have this additionally formed silicide layer.

FIG. 18 also illustrates an insulating oxide layer 134 that can be blanket deposited or grown over the substrate 110. The insulating oxide layer 134 can be formed, for example, of silicon dioxide, silicon nitride, silicon oxynitride, ON, NO, ONO or TEOS, among others. The insulating oxide layer 134 can be subsequently etched to form gate stack sidewall spacers, if desired.

As mentioned previously, if desired, the substrate 110 can be initially doped with p-type dopants to form a p-type substrate 110. However, the substrate 110 can be doped at any other convenient time during fabrication of pixel cell 200. Further, the substrate 110 can be formed by using epi wafers.

Figure 19:
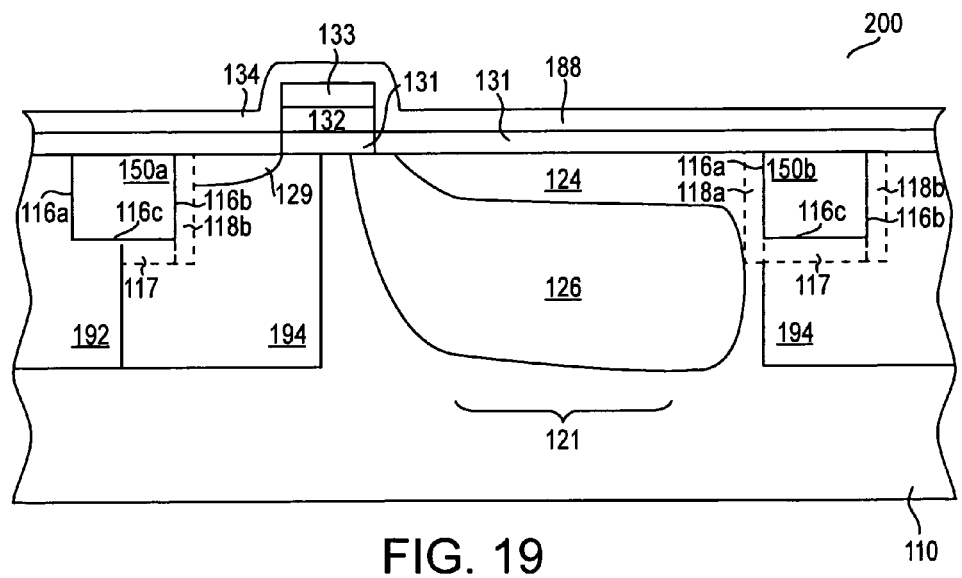
FIG. 19 is a cross-sectional view of the representative substrate of FIG. 13, at a stage of processing subsequent to that shown in FIG. 18.

Next, FIG. 19 illustrates the formation of the p-n-p photodiode 188 with p-type pinned surface region 124, n-type region 126 and p-type substrate 110. The n-type region 126 is formed by implanting n-type dopants in the area of the p-type substrate 110 directly beneath the active area of the pixel cell 200. The n-type region 126 forms a photosensitive charge collection region 121 for collecting photogenerated electrons. N-type dopants such as arsenic, antimony, or phosphorus, among others, may be employed. Since the p-type doped regions 118a, 118b, and 117 surrounding the second trench isolation region 150b are present, the n− type region 126 can be formed close to the second trench isolation region 150b. In particular, the presence of doped regions 118a and 117 allow the n-type region 126 to be formed close to the second trench isolation region 150b.

Further, the n-type region 126 can be formed using one or multiple implants to grade the implant profile of the charge collection region 121, e.g., creating a doping gradient. The n-type region 126 can also have a uniform dopant concentration such that no doping gradient exists. The n-type region 126 can be formed very close and/or in contact with the doped region 118a and/or 117 of the second trench isolation region 150b. A larger charge collection region 121 enhances the capacitance of the photodiode 188.

Next, the p-type pinned surface region 124 is formed by conducting a dopant implantation with p-type dopants implanted into the active area of the p-type substrate 110 over the n-type region 126 and between the transfer gate 130 and second trench isolation region 150b. Accordingly, the p-type pinned surface region 124 is linked via doped regions 118a and 117 to p-well 194 and p-type substrate 110. Doped region 118a of the second trench isolation region 150b provides good substrate-to-surface connection.

The photodiode 188 can be self-aligned to the second trench isolation region 150b, surrounded by doped regions 118a, 118b, and 117 and transfer transistor gate 130, as a result of the presence of p-type doped regions 118a and 117. Doped regions 118a and 117 act as self-aligned masks in forming n-type region 126.

After dopant implantation and thermal processing, the n-type region 126 diffuses outwards so that it physically contacts with p-type doped regions 118a and 117 of the second trench isolation region 150b and p-well 194. In this manner, the n-type region 126 is formed self-aligned to doped regions 118a, 117, and p-well 194 of the second trench isolation region 150b.

The remaining structures of a pixel cell 200, including floating diffusion region 129, a reset transistor (not illustrated), source follower transistor (not illustrated) and row select transistor (not illustrated) can be formed by well-known methods in the art to obtain an operative pixel. Methods of forming an operative pixel cell 200 for CMOS image circuits of the type discussed above are generally known and discussed in, for example, U.S. Pat. Nos. 6,756, 616; 6,696,314; and 6,661,047, the disclosures of which are incorporated by reference herein.

For instance, conventional processing steps may be employed to form contacts and wiring to connect gate lines and other connections in the pixel cell 200. The entire surface may be covered with a passivation layer that can be CMP planarized and etched to provide contact holes, which are then metallized to provide contacts to the reset gate, transfer gate and other pixel gate structures, as needed. Conventional multiple layers of conductors and insulators to other circuit structures may also be used to interconnect the structures of the pixel cell and to connect the pixel cell to logic circuits on the periphery of a pixel array.

The first and second trench isolation regions 150a and 150b surrounded by areas having a higher concentration of p-type dopants other than areas spaced from the first and second trench isolation regions by the higher concentration areas, act to reduce cross-talk between adjacent pixel sensor cells by providing a good leakage electrical connection from the p-type pinned surface region 124 to the p-type substrate 110 and p-well 194 via linking doped region 118a of the second trench isolation region 150b. Further, leakage charges from the charge collection region 121 can be reflected back from the first and second trench isolation regions 150a and 150b to the charge collection region 121. In addition to the benefits provided above, the first and second trench isolation regions 150a and 150b provide good pixel-to-pixel optical isolation in a solid state imager sensor.

Further, the second trench isolation region 150b also reduces the formation of trap sites along the bottom portion 116c and sidewall 116a of the second trench isolation region 150b, which become charged and may affect the charge collection 121 capacity of the photodiode 188 structure. A reduction in the formation of these trap sites along the bottom portion 116c and sidewall 116a of the second trench isolation region 150b also helps reduce dark current generation and leakage near and along the trench sidewalls bottom portion.

Although the above embodiments have been described with reference to the formation of a p-n-p photodiode 188 (FIGS. 11A-11D), it must be understood that the invention is not limited to these exemplary embodiments. The invention has equal applicability to n-p-n photodiodes comprising a p-type charge collection region formed in an n-type region. The first and second trench isolation regions 150a and 150b in this exemplary embodiment would have doped regions 118a, 118b, and 117, comprising n-type dopants rather than p-type dopants as illustrated in FIGS. 11A-11D.

Moreover, the conductivity type of all structures would change accordingly, with the transfer transistor gate 130 corresponding to a PMOS transistor. Still further, while the first and second trench isolation regions 150a and 150b have been illustrated in connection with the pixel structure of a CMOS imager, it can be incorporated into any solid state imager.

A typical processor system that includes a CMOS imager device 542 having a pixel array in which the pixels 200 are constructed according to the present invention is illustrated generally at 500 in FIG. 20.

A processor system, such as a camera system 500 for example, generally comprises a central processing unit (CPU) 544, for example, a microprocessor, that communicates with an input/output (I/O) device 546 over a bus 552. The CMOS imager device 542 having an array of pixels isolated from one another using the first and second trench isolation regions 150a and 150b of the invention, also communicates with the system over bus 552 or other communication link. The camera system 500 also includes random access memory (RAM) 548, and, may include peripheral devices such as a removable memory device 554 which also communicates with CPU 544 over the bus 552. It may also be desirable to integrate the processor 554, CMOS imager device 542, memory 548, and I/O device 546 on a single IC chip.

It should be appreciated that the trench isolation regions of FIGS. 1A-1E and 11A-11D and methods of formation, can be used to fabricate a variety of integrated circuits which can include devices that exhibit reduced current leakage and/or reduced electronic and/or optical cross-talk. More generally, the isolation regions and their methods of formation described by this invention can be used to provide isolation for an active region on any semiconductor device.

The above description and drawings are only to be considered illustrative of exemplary embodiments which achieve the features and advantages of the invention. Although exemplary embodiments of the present invention have been described and illustrated herein, many modifications, even substitutions of materials, can be made without departing from the spirit or scope of the invention. Accordingly, the above description and accompanying drawings are only illustrative of exemplary embodiments that can achieve the features and advantages of the present invention. It is not intended that the invention be limited to the embodiments shown and described in detail herein. The invention is limited only by the scope of the appended claims.

What is claimed as new and desired to be protected by Letters Patent of the United States is:

1. A method of forming a trench isolation region in a semiconductor substrate, said method comprising:
   forming a first doped region of a first doping concentration of a first conductivity type in a semiconductor substrate;
   forming a second doped region within said first doped region having a second doping concentration higher than said first doping concentration of said first conductivity type; and
   forming a trench isolation region having a trench at least in a portion of said second doped region of said substrate such that substantially all of at least one sidewall of said trench abuts said second doped region,
   wherein said steps of forming said first doped region, forming said second doped region, and forming said trench isolation region are performed in sequence.

2. The method of claim 1, wherein said step of forming a first doped region forms a well within said substrate.

3. The method of claim 1, wherein said step of forming a first doped region forms a blanket doped region within said substrate.

4. The method of claim 1, wherein said step of forming said trench isolation region further comprises forming at least one sidewall and a bottom portion of said trench isolation region adjacent to said second doped region.

5. The method of claim 4, further comprising forming a second trench sidewall adjacent to said second doped region.

6. The method of claim 5, wherein said second doped region has substantially the same dopant concentration at portions adjacent said sidewalls and bottom portion of said trench isolation region.

7. The method of claim 5, wherein said second doped region has a different dopant concentration at a portion adjacent at least one said sidewall than at a portion adjacent said bottom portion.

8. The method of claim 4, wherein said step of forming a bottom portion of said trench isolation region further comprises forming the bottom portion self-aligned to a portion of said second doped region adjacent at least one sidewall of said trench isolation region.

9. The method of claim 4, wherein said step of forming a bottom portion of said trench isolation region further comprises forming the bottom portion to overlap a portion of said second doped region adjacent at least one sidewall of said trench isolation region.

10. The method of claim 5, wherein said step of forming a bottom portion of said trench isolation region further comprises forming the bottom portion to overlap a portion of said second doped region adjacent said sidewalls of said trench isolation region.

11. The method of claim 1, wherein said step of forming a trench isolation region further comprises forming a bottom portion such that it is not adjacent to said second doped region.

12. A method as in claim 1, wherein said at least one sidewall has a substantially uniform doping concentration of said first conductivity type equal to said second doping concentration of said first conductivity type.

13. A method of fabricating an integrated circuit having a plurality of active regions separated by trench isolation regions, said method comprising:

forming a plurality of first doped regions in a semiconductor substrate, said first doped regions being implanted with ions of a first conductivity type and having a first dopant concentration;

forming a plurality of second doped regions in said plurality of first doped regions having a second dopant concentration higher than said first dopant concentration;

forming a plurality of trench isolation regions in said plurality of second doped regions having a bottom portion and sidewalls, wherein each trench isolation region has at least one sidewall being formed adjacent to the second doped region; and filling said trench isolation region with a dielectric material, wherein said steps of forming said plurality of first doped regions, forming said plurality of second doped regions, and forming said plurality of trench isolation regions are performed in sequence.

14. A method as in claim 13, wherein said at least one sidewall has a substantially uniform doping concentration of said first conductivity type equal to said second doping concentration of said first conductivity type.

15. A method of forming an imaging device, said method comprising:

forming a first doped region of a first doping concentration of a first conductivity type in a semiconductor substrate;

forming a second doped region within said first doped region having a second doping concentration higher than said first doping concentration of said first conductivity type;

forming a trench isolation region at least in a portion of said second doped region of said substrate such that at least one sidewall of said trench isolation region is formed adjacent to said second doped region and has a substantially uniform doping concentration of said first conductivity type equal to said second doping concentration of said first conductivity type; and forming a photosensor adjacent to said at least one sidewall of said trench isolation region, wherein said steps of forming said first doped region, forming said second doped region, and forming said trench isolation region are performed in sequence.

16. The method of claim 15, wherein said step of forming a first doped region forms a well within said substrate.

17. The method of claim 15, wherein said step of forming a first doped region forms a blanket doped region within said substrate.

18. The method of claim 15, wherein said step of forming said trench isolation region further comprises forming at least one sidewall and a bottom portion of said trench isolation region adjacent to said second doped region.

19. The method of claim 18, further comprising forming a second trench sidewall adjacent to a third doped region.

20. The method of claim 19, wherein said third doped region is an n-well.

21. The method of claim 18, wherein said second doped region has substantially the same dopant concentration at portions adjacent said at least one sidewall and bottom portion of said trench isolation region.

22. The method of claim 18, wherein said second doped region has a different dopant concentration at a portion adjacent at least one said sidewall than at a portion adjacent said bottom portion.

23. The method of claim 18, wherein said step of forming a bottom portion of said trench isolation region further comprises forming the bottom portion self-aligned to a portion of said second doped region adjacent at least one sidewall of said trench isolation region.

24. The method of claim 18, wherein said step of forming a bottom portion of said trench isolation region further comprises forming the bottom portion to overlap a portion of said second doped region adjacent at least one sidewall of said trench isolation region.

25. The method of claim 15, wherein said step of forming a trench isolation region further comprises forming a bottom portion such that it is not adjacent to said second doped region.

26. The method of claim 15, wherein said step of forming a photosensor further comprises forming a photodiode with an n-type region adjacent to said at least one sidewall of trench isolation region adjacent to said second doped region.

27. A method as in claim 15, wherein substantially all of said at least one sidewall abuts said second doped region.

28. A method of forming an imaging structure, said method comprising:

forming at least a portion of a trench isolation region in a first doped region with a first conductivity type and a first dopant concentration, said trench isolation region is formed to have at least one trench sidewall formed adjacent to said first doped region, wherein at least a portion of said first doped region is surrounded by a second doped region of the first conductivity type having a second dopant concentration, said first dopant concentration being greater than said second dopant concentration;

forming a third doped region with a second conductivity type formed at least partially adjacent to said trench isolation region; and forming a photosensor adjacent first doped region.

29. A method as in claim 28, wherein said first conductivity type is p-type.

30. A method as in claim 28, wherein said second doped region is a p-well region.

31. A method as in claim 28, wherein said second conductivity type is n-type.

32. A method as in claim 28, wherein said third doped region is a charge collection region.

33. A method as in claim 32, wherein said charge collection region further comprises: a pinned surface layer with p-type conductivity formed over a n-type region, said pinned surface layer having a third dopant concentration of the first conductivity type, wherein said first dopant concentration is greater than said third dopant concentration.

34. A method as in claim 28, wherein said third doped region is an n-well region.

35. A method as in claim 28, wherein said image structure is a CCD imager.

36. A method as in claim 28, wherein said image structure is a CMOS imager.

* * * * *

UNITED STATES PATENT AND TRADEMARK OFFICE
CERTIFICATE OF CORRECTION

| | |
|---|---|
| PATENT NO. | : 7,262,110 B2 |
| APPLICATION NO. | : 10/922831 |
| DATED | : August 28, 2007 |
| INVENTOR(S) | : Jin |

Page 1 of 1

It is certified that error appears in the above-identified patent and that said Letters Patent is hereby corrected as shown below:

In column 21, line 12, in Claim 13, after "region has" insert -- a trench with substantially all of --.

In column 21, lines 12-13, in Claim 13, after "one sidewall" delete "being formed adjacent to" and insert -- abutting --, therefor.

In column 21, line 14, in Claim 13, after "trench isolation" delete "region" and insert -- regions --, therefor.

Signed and Sealed this

Thirteenth Day of November, 2007

JON W. DUDAS
*Director of the United States Patent and Trademark Office*